US008476932B2

(12) United States Patent
Wang et al.

(10) Patent No.: US 8,476,932 B2

(45) Date of Patent: Jul. 2, 2013

(54) MULTIPLEX GATE DRIVING CIRCUIT

(75) Inventors: Hsiao-Wen Wang, Hsin-Chu (TW); Yu-Hsuan Li, Hsin-Chu (TW); Jui-Chi Lo, Hsin-Chu (TW); Chun-Hung Kuo, Hsin-Chu (TW); Sheng-Chao Liu, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 13/238,148

(22) Filed: Sep. 21, 2011

(65) Prior Publication Data

US 2012/0133392 A1 May 31, 2012

(30) Foreign Application Priority Data

Nov. 30, 2010 (TW) ............................... 99141463 A

(51) Int. Cl.

| | |
|---|---|
| *G11C 8/00* | (2006.01) |
| *H03K 19/082* | (2006.01) |
| *H03K 19/094* | (2006.01) |

(52) U.S. Cl.

USPC ............................ 326/105; 326/106; 326/108

(58) Field of Classification Search

None

See application file for complete search history.

(56) References Cited

U.S. PATENT DOCUMENTS

| | | | | |
|---|---|---|---|---|
| 6,831,625 | B2 * | 12/2004 | Matsushima et al. | 345/98 |
| 7,817,771 | B2 | 10/2010 | Tsai et al. | |
| 2004/0066361 | A1 * | 4/2004 | Ishii et al. | 345/87 |
| 2011/0002437 | A1 | 1/2011 | Su et al. | |

* cited by examiner

*Primary Examiner* — Anh Tran

(74) *Attorney, Agent, or Firm* — WPAT, PC; Justin King

(57) ABSTRACT

A multiplex gate driving circuit includes plural driving modules. In comparison with the prior art, each driving stage of the driving module has less number of transistors. From the first to the seventh example, each driving stage is implemented by only four transistors. In the eighth example and the ninth example, each driving stage is implemented by only two transistors. In other words, the driving stage of the multiplex gate driving circuit has less number of transistors, thereby reducing the layout area of the invisible zone of the LCD panel.

25 Claims, 16 Drawing Sheets

MULTIPLEX GATE DRIVING CIRCUIT

TECHNICAL FIELD

The disclosure relates to a multiplex gate driving circuit, and more particularly to a multiplex gate driving circuit for driving a liquid crystal display (LCD) panel.

BACKGROUND

Generally, the LCD panel usually comprises a visible zone and an invisible zone and the gate on array (GOA) are integrated on the invisible zone. The invisible zone comprises the gate driver for sequentially generating a plurality of gate driving signals. The visible zone is a thin film transistor array comprising plural gate lines. The gate driving signals are sequentially provided to the gate lines, and thus the pixels connected to the gate lines are sequentially turned on.

FIG. 1A is a schematic circuit diagram illustrating a multiplex gate driving circuit. FIG. 1B is a schematic timing waveform diagram illustrating associated signal processed by the multiplex gate driving circuit of FIG. 1A. The signals A1~A4 may be referred as master signals and the signals ENB1*y*~ENB3*y* may be referred as slave signals. The master signals A1~A4 are generated by a shift register 500.

As shown in FIG. 1B, the master signals A1~A4 that are non-overlapped pulses with the same width are sequentially generated. Each of the slave signals $ENB1_y$~$ENB3_y$ includes plural pulses with the same frequency but different phases. Please refer to FIG. 1B. A cycle period of each slave signal is equal to the pulse width of each master signal. In the three slave signals $ENB1_y$~$ENB3_y$, the duty cycle of each slave signal is ⅓, and the phase difference between every two adjacent slave signals is 120 degrees (i.e. 360/3=120).

Please refer to FIG. 1A again. Each master signal is transmitted to three driving stages 502. In addition, the slave signals are received by respective driving stages 502. Consequently, these driving stages sequentially output respective gate driving signal Y1~Y6 . . . , and so on. From FIG. 1A, it is found that each driving stage of the multiplex gate driving circuit comprises a NAND gate 503 and an inverter 504. In other words, each driving stage of the multiplex gate driving circuit is implemented by six transistors.

SUMMARY

Therefore, the disclosure provides a multiplex gate driving circuit whose driving stage has less number of transistors, thereby reducing the area of the invisible zone of the LCD panel.

In accordance with an aspect, the disclosure provides a multiplex gate driving circuit. The multiplex gate driving circuit includes m shift registers and n driving stages. The m shift registers are used for receiving a clock signal and sequentially generating m master signals. The m master signals are non-overlapped positive pulses with a first width. An x-th shift register of the m shift registers generates an x-th master signal. The n driving stages are used for respectively receiving n slave signals and sequentially generating n gate driving signals. A duty cycle of each slave signal is equal to 1/n. A phase difference between every two adjacent slave signals is equal to 360/n degrees. Each of the n slave signals includes plural positive pulses. An i-th driving stage of the n driving stages includes an n-type transistor and a p-type transistor. The n-type transistor has a control terminal receiving an i-th slave signal of the n slave signals, a first terminal receiving the x-th master signal and a second terminal generating an i-th gate driving signal of the n gate driving signals.

The p-type transistor has a control terminal receiving the i-th slave signal, a first terminal connected with the second terminal of the n-type transistor and a second terminal receiving an inverted power-off control signal.

In accordance with another aspect, the disclosure provides a multiplex gate driving circuit. The multiplex gate driving circuit includes m shift registers and n driving stages. The m shift registers are used for receiving a clock signal and sequentially generating m master signals. The m master signals are non-overlapped positive pulses with a first width. An x-th shift register of the m shift registers generates an x-th master signal. The n driving stages are used for respectively receiving n slave signals and sequentially generating n gate driving signals. A duty cycle of each slave signal is equal to 1/n. A phase difference between every two adjacent slave signals is equal to 360/n degrees. Each of the n slave signals includes plural negative pulses. An i-th driving stage of the n driving stages includes an n-type transistor and a p-type transistor. The p-type transistor has a control terminal receiving an i-th slave signal of the n slave signals, a first terminal receiving the x-th master signal and a second terminal generating an i-th gate driving signal of the n gate driving signals. The n-type transistor has a control terminal receiving the i-th slave signal, a first terminal connected with the second terminal of the p-type transistor and a second terminal receiving an inverted power-off control signal.

In accordance with another aspect, the disclosure provides a multiplex gate driving circuit. The multiplex gate driving circuit includes m shift registers and n driving stages. The m shift registers are used for receiving a clock signal and sequentially generating m master signals. The m master signals are non-overlapped negative pulses with a first width. An x-th shift register of the m shift registers generates an x-th master signal. The n driving stages are used for respectively receiving n slave signals and sequentially generating n gate driving signals. A duty cycle of each slave signal is equal to 1/n. A phase difference between every two adjacent slave signals is equal to 360/n degrees. Each of the n slave signals includes plural positive pulses. An i-th driving stage of the n driving stages includes an n-type transistor, a p-type transistor and an inverter. The n-type transistor has a control terminal receiving an i-th slave signal of the n slave signals and a first terminal receiving the x-th master signal. The inverter has an input terminal connected with a second terminal of the n-type transistor and an output terminal generating an i-th gate driving signal of the n gate driving signals. The p-type transistor has a control terminal receiving the i-th slave signal, a first terminal connected with the second terminal of the n-type transistor and a second terminal receiving a power-off control signal.

In accordance with another aspect, the disclosure provides a multiplex gate driving circuit. The multiplex gate driving circuit includes m shift registers and n driving stages. The m shift registers are used for receiving a clock signal and sequentially generating m master signals. The m master signals are non-overlapped negative pulses with a first width. An x-th shift register of the m shift registers generates an x-th master signal. The n driving stages are used for respectively receiving n slave signals and sequentially generating n gate driving signals. A duty cycle of each slave signal is equal to 1/n. A phase difference between every two adjacent slave signals is equal to 360/n degrees. Each of the n slave signals includes plural negative pulses. An i-th driving stage of the n driving stages includes an n-type transistor, a p-type transistor and an i-th inverter. The p-type transistor has a control terminal receiving an i-th slave signal of the n slave signals and a first terminal receiving the x-th master signal. The inverter has an input terminal connected with a second terminal of the p-type transistor and an output terminal generating an i-th gate driving signal of the n gate driving signals. The n-type transistor has a control terminal receiving the i-th slave signal, a first terminal connected with the second terminal of the p-type transistor and a second terminal receiving a power-off control signal.

In accordance with another aspect, the disclosure provides a multiplex gate driving circuit. The multiplex gate driving circuit includes m shift registers and n driving stages. The m shift registers are used for receiving a clock signal and sequentially generating m master signals. The m master signals are non-overlapped negative pulses with a first width. An x-th shift register of the m shift registers generates an x-th master signal. The n driving stages are used for respectively receiving n slave signals and sequentially generating n gate driving signals. A duty cycle of each slave signal is equal to 1/n. A phase difference between every two adjacent slave signals is equal to 360/n degrees. Each of the n slave signals includes plural negative pulses. An i-th driving stage of the n driving stages includes an n-type transistor, a p-type transistor and an inverter. The p-type transistor has a control terminal receiving the x-th master signal and a first terminal receiving an i-th slave signal of the n slave signals. The inverter has an input terminal connected with a second terminal of the p-type transistor and an output terminal generating an i-th gate driving signal of the n gate driving signals. The n-type transistor has a control terminal receiving the x-th master signal, a first terminal connected with the second terminal of the p-type transistor and a second terminal receiving a power-off control signal.

DETAILED DESCRIPTION OF EMBODIMENTS

The disclosure will now be described more specifically with reference to the following embodiments. It is to be noted that the following descriptions of the embodiments are presented herein for purpose of illustration and description only. It is not intended to be exhaustive or to be limited to the precise form disclosed.

Figure 1A:
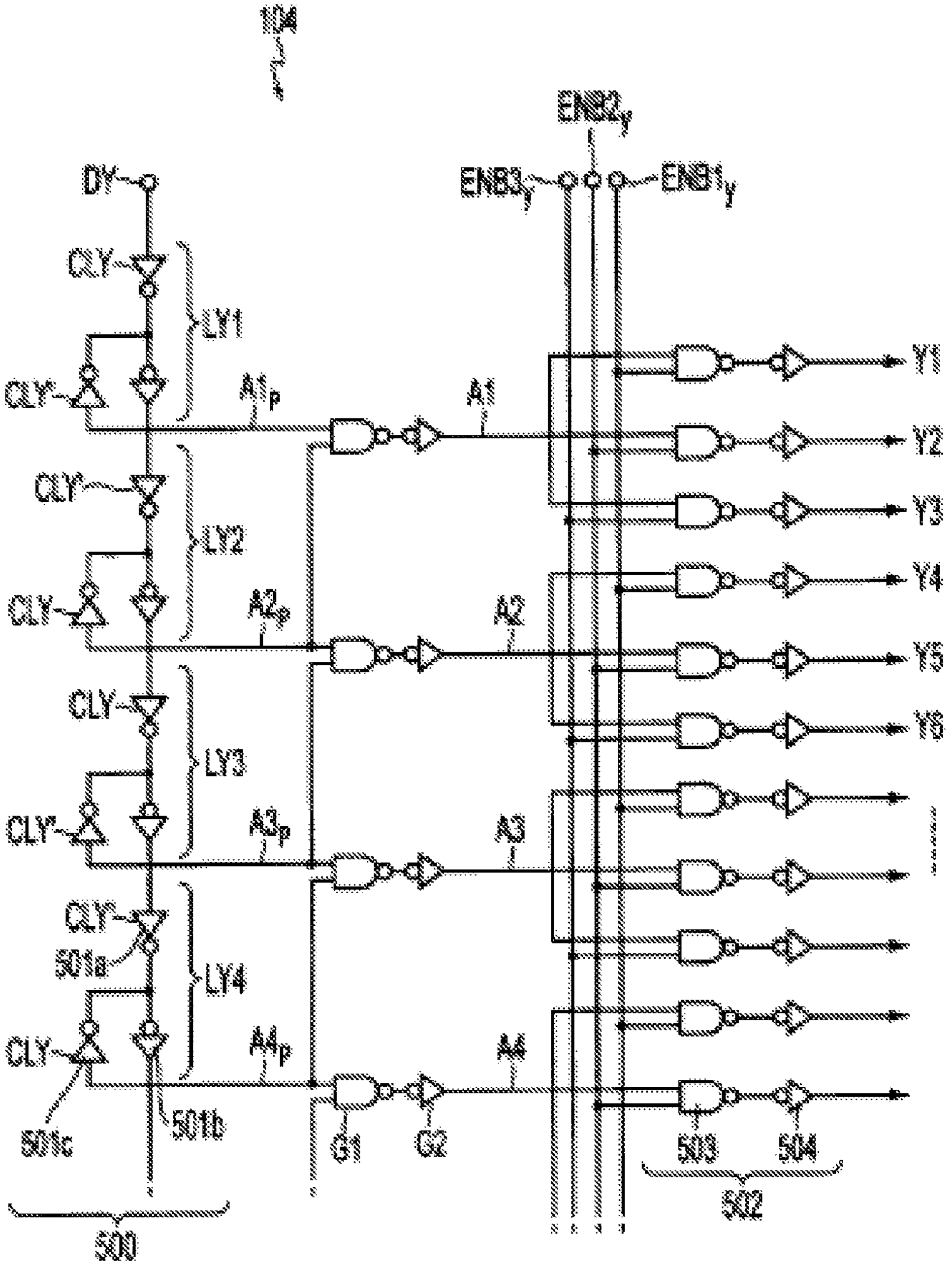
FIG.1A (Prior Art)
FIG. 1A is a schematic circuit diagram illustrating a multiplex gate driving circuit.
Figure 1B:
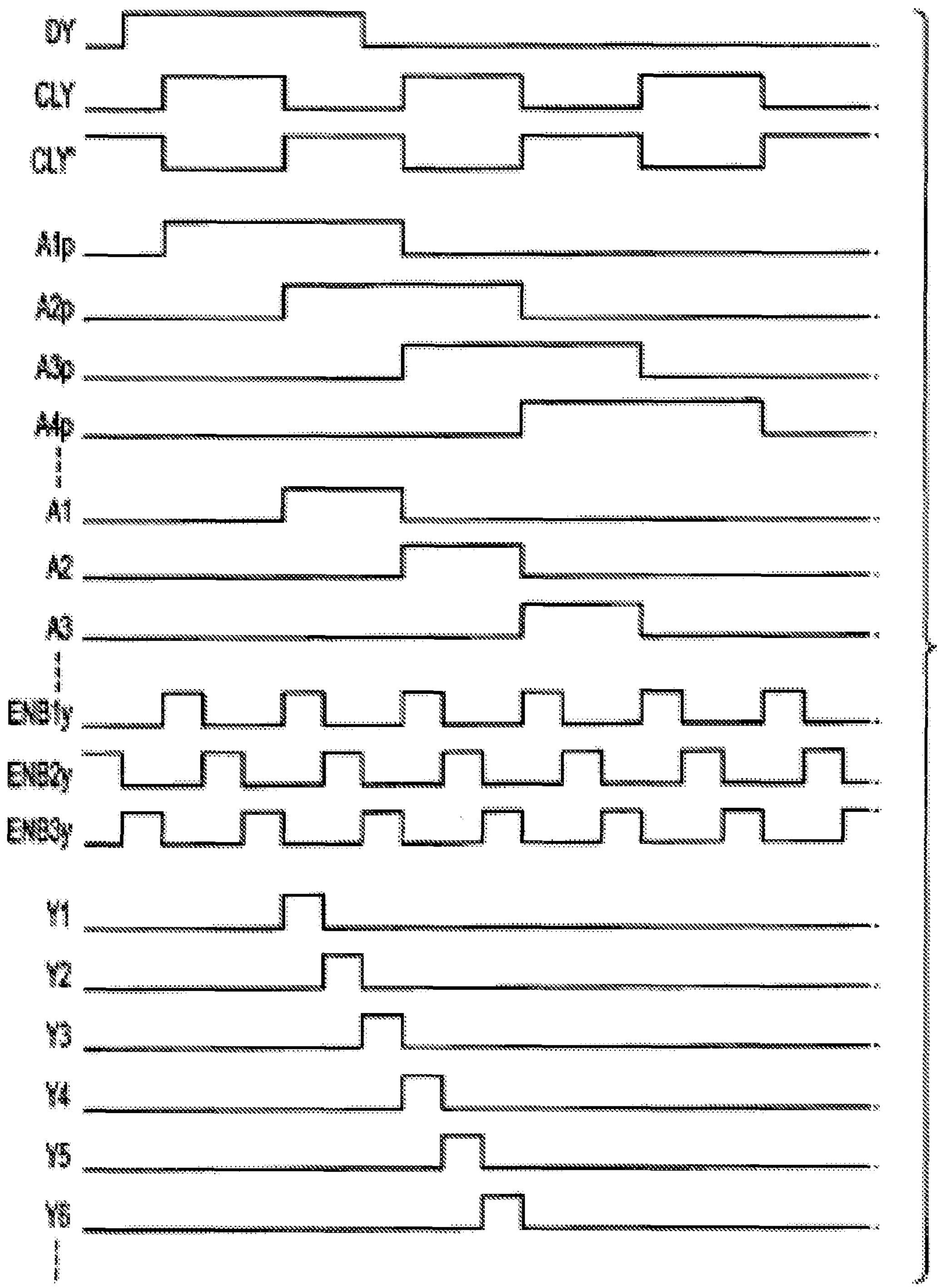
FIG.1B (Prior Art)
FIG. 1B is a schematic timing waveform diagram illustrating associated signal processed by the multiplex gate driving circuit of FIG. 1A.
Figure 2A:
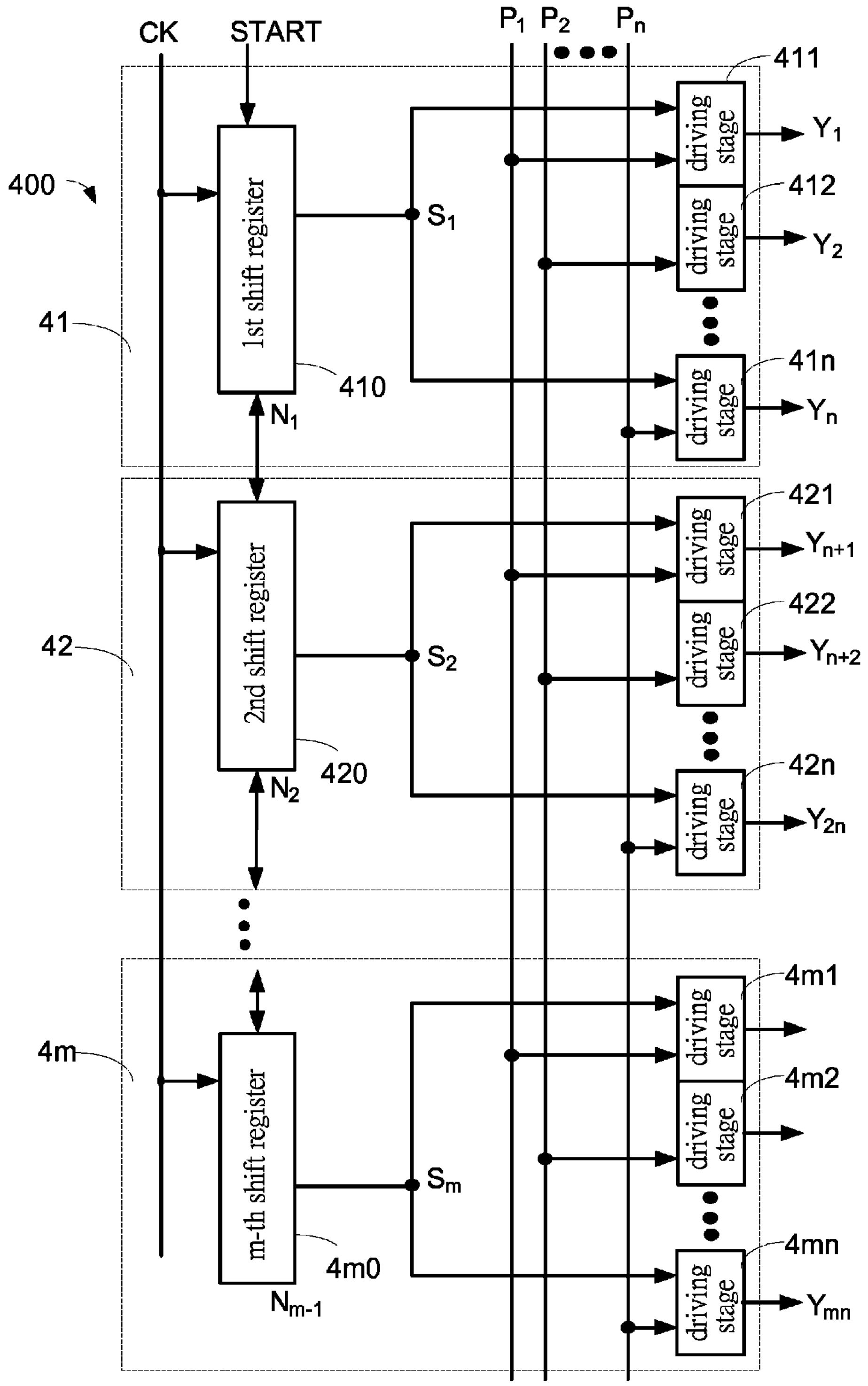
FIG. 2A is a schematic circuit diagram illustrating a multiplex gate driving circuit according to an embodiment.

FIG. 2A is a schematic circuit diagram illustrating a multiplex gate driving circuit according to an embodiment. FIGS. 2B~2E are schematic timing waveform diagrams illustrating associated signal processed by the multiplex gate driving circuit of FIG. 2A. As shown in FIG. 2A, a clock signal CK, a start signal START and slave signals $P_1$~$P_n$ are provided to the multiplex gate driving circuit 400. The multiplex gate driving circuit 400 comprises m driving modules 41~**4*m*. Each of the driving modules 41~4*m* comprises a corresponding shift register and n driving stages. The shift register may generate a master signal. That is, the m shift registers 410~4*m*0 may generate m master signals $S_1$~$S_m$. By cooperating with the driving stages 411~41*n*, 421~42*n*, . . . , and 4*m*1~4*mn*, the multiplex gate driving circuit 400** generate m×n gate driving signals $Y_1$~$Y_{mn}$.

In response to the start signal START, the first shift register 410 is triggered to generate the first master signal $S_1$ and issues a first notification signal $N_1$ to the second shift register 420. In response to the first notification signal, the second shift register 420 is triggered to generate the second master signal $S_2$ and issues a second notification signal $N_2$ to the first shift register 410 and the third shift register 430. In response to the second notification signal $N_2$, the first shift register 410 stops generating the first master signal $S_1$, and the third shift register 430 issues the third master signal $S_3$.

From the above discussion, in response to the (x−1)-th notification signal $N_{x-1}$ from the (x−1)-th shift register, the x-th shift register generates the x-th master signal $S_x$ and issues the x-th notification signal $N_x$ to the x−1)-th shift register or the (x+1)-th shift register, the transmission direction is depends on the start signal trigs from up or down. In response to the x-th notification signal, the (x+1)-th shift register stops generating the (x−1)-th master signal $S_{x-1}$, and the (x+1)-th shift register generates the (x+1)-th master signal $S_{x+}$.

Moreover, for creating the gate driving signals, the master signals $S_1$~$S_m$ and the slave signals $P_1$~$P_n$ may have diverse forms (e.g. positive pulses or negative pulses) by employing proper configurations of the shift registers and the driving stages. Hereinafter, the master signals $S_1$~$S_m$ and the slave signals $P_1$~$P_n$ in various forms will be illustrated with reference to FIGS. 2B~2E.

Figure 2B:
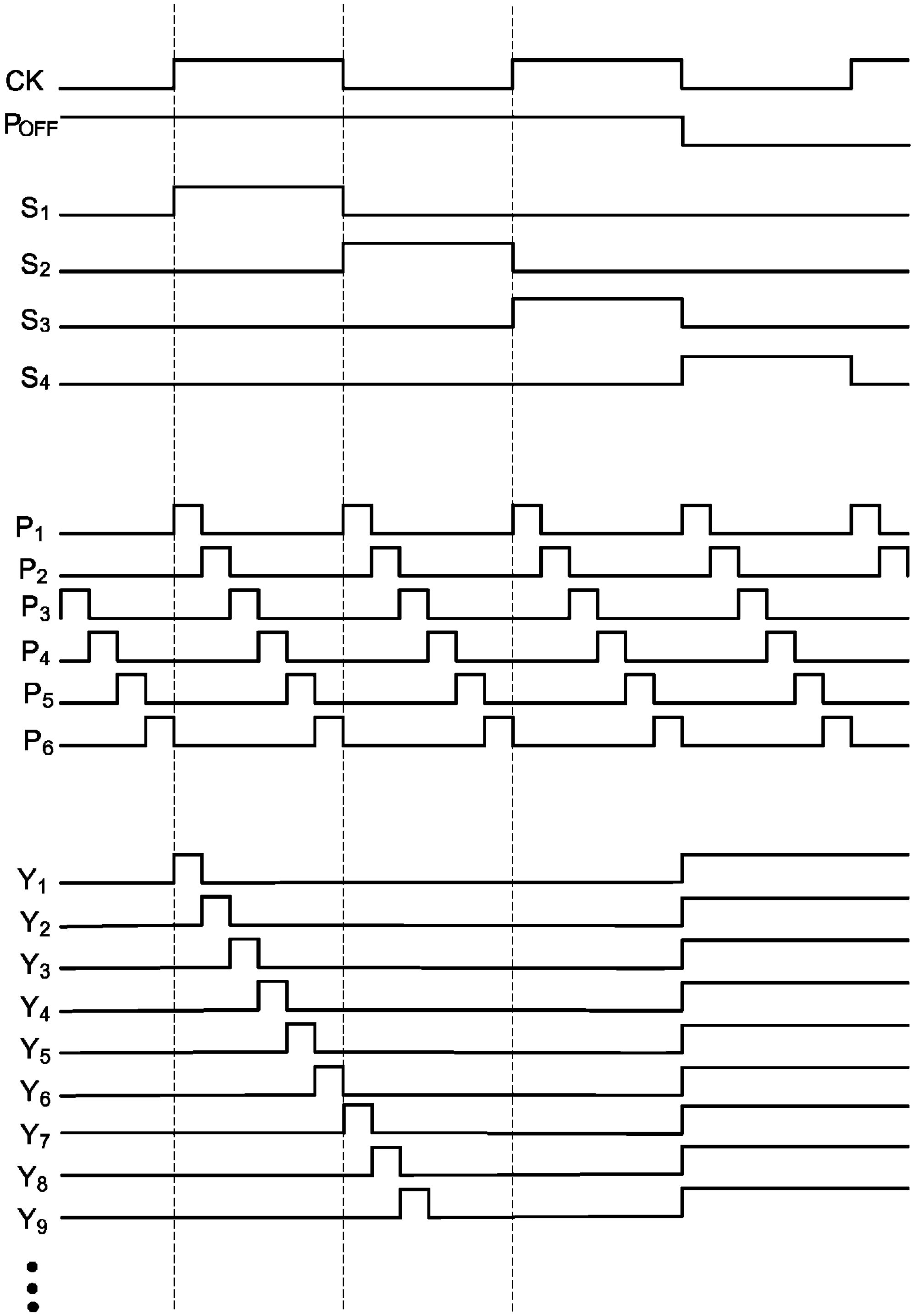
FIGS. 2B~2E are schematic timing waveform diagrams illustrating associated signal processed by the multiplex gate driving circuit of FIG. 2A.

In FIG. 2B, four shift registers (m=4) and six slave signals (n=6) are illustrated. According to the clock signal CK, four master signals $S_1$~$S_4$ that are non-overlapped positive pulses with the same duty are sequentially generated. Each of the slave signals $P_1$~$P_6$ includes plural positive pulses with the same frequency but different phases. As is known from FIG. 2B, a cycle period of each slave signal is equal to the pulse width of each master signal. In the six slave signals $P_1$~$P_6$, the duty cycle of each slave signal is 1/6, and the phase difference between every two adjacent slave signals is 60 degrees (i.e. 360/6=60). It is noted that if there are n slave signals, the phase difference between every two adjacent slave signals is 360/n degrees.

Figure 2C:
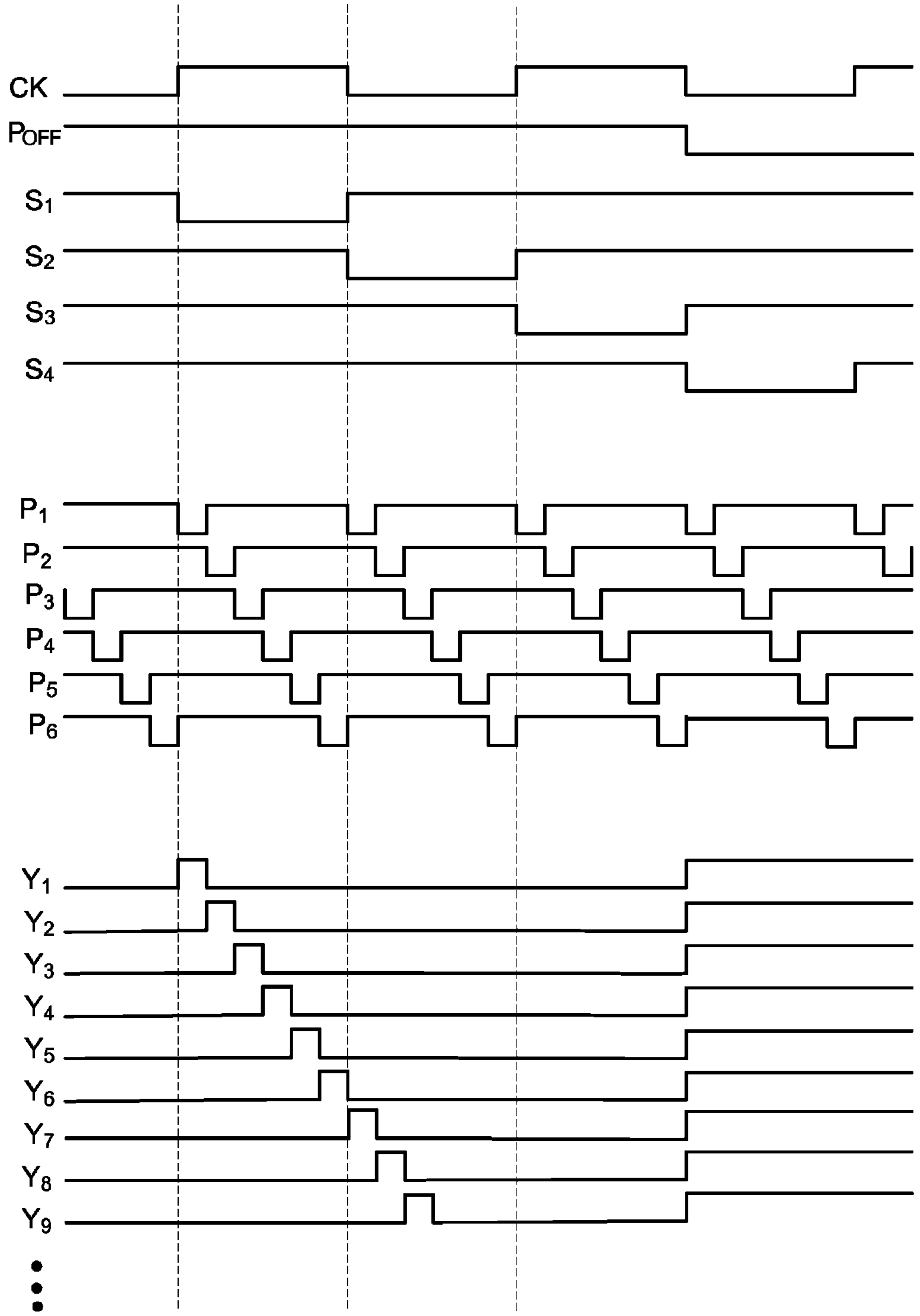

In FIG. 2C, four shift registers (m=4) and six slave signals (n=6) are illustrated. According to the clock signal CK, four master signals $S_1$~$S_4$ that are non-overlapped negative pulses with the same width are sequentially generated. Each of the slave signals $P_1$~$P_6$ includes plural negative pulses with the same frequency but different phases. As is known from FIG. 2C, a cycle period of each slave signal is equal to the pulse width of each master signal. In the six slave signals $P_1$~$P_6$, the duty cycle of each slave signal is 1/6, and the phase difference between every two adjacent slave signals is 60 degrees (i.e. 360/6=60).

Figure 2D:
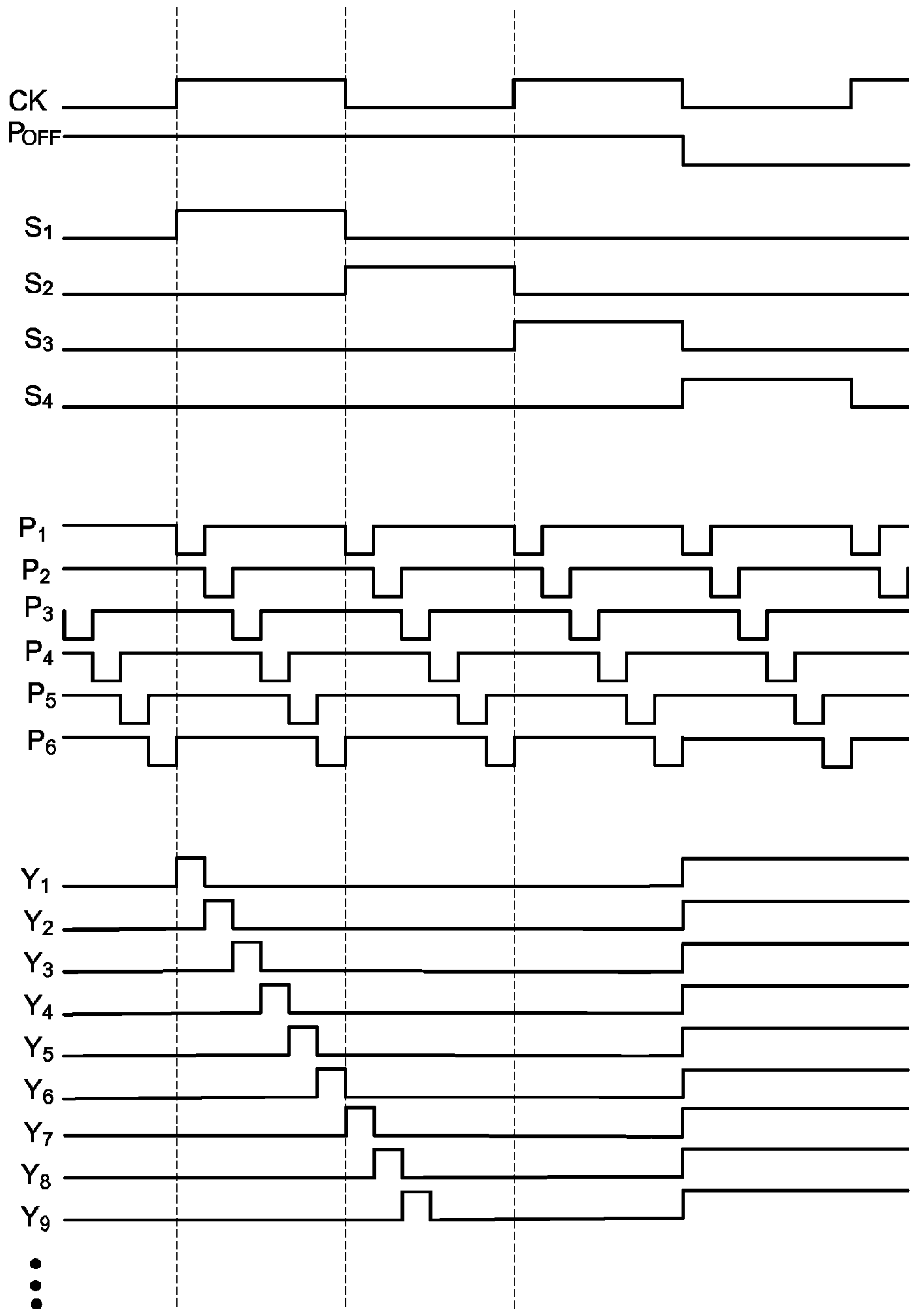

In FIG. 2D, four shift registers (m=4) and six slave signals (n=6) are illustrated. According to the clock signal CK, four master signals $S_1$~$S_4$ that are non-overlapped positive pulses with the same width are sequentially generated. Each of the slave signals $P_1$~$P_6$ includes plural negative pulses with the same frequency but different phases. As is known from FIG. 2D, a cycle period of each slave signal is equal to the pulse width of each master signal. In the six slave signals $P_1$~$P_6$, the duty cycle of each slave signal is 1/6, and the phase difference between every two adjacent slave signals is 60 degrees (i.e. 360/6=60).

Figure 2E:
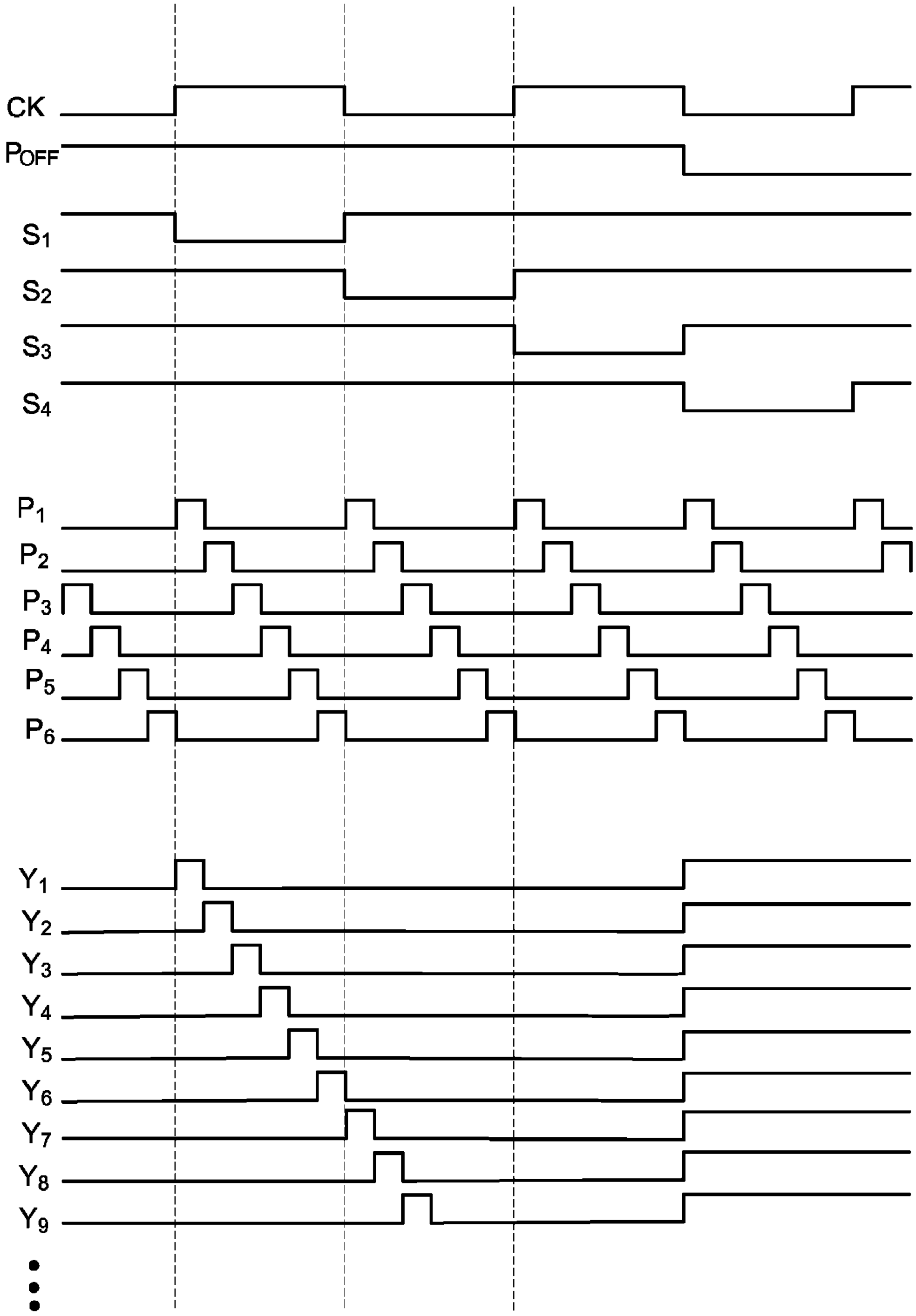

In FIG. 2E, four shift registers (m=4) and six slave signals (n=6) are illustrated. According to the clock signal CK, four master signals $S_1$~$S_4$ that are non-overlapped negative pulses with the same width are sequentially generated. Each of the slave signals $P_1$~$P_6$ includes plural positive pulses with the same frequency but different phases. As is known from FIG. 2E, a cycle period of each slave signal is equal to the pulse width of each master signal. In the six slave signals $P_1$~$P_6$, the duty cycle of each slave signal is 1/6, and the phase difference between every two adjacent slave signals is 60 degrees (i.e. 360/6=60).

In this embodiment, the first driving module 41 of the multiplex gate driving circuit 400 generates six gate driving signal $Y_1$~$Y_6$ according to the first master signal $S_1$ and the six slave signals $P_1$~$P_6$. The operating principles of other driving modules are similar to those of the first driving module, and are not redundantly described herein. Please refer to FIGS. 2B~2E again. A power-off control signal $P_{OFF}$ is also received by the multiplex gate driving circuit 400. Normally, the power-off control signal $P_{OFF}$ is maintained in a high level state. When the power-off control signal $P_{OFF}$ is switched to a low level state, all of the gate driving signals $Y_1$~$Y_{mn}$ are changed to the high level state. Under this condition, the image sticking phenomenon that usually occurs in the LCD panel will be eliminated. Hereinafter, the detailed circuitry of the multiplex gate driving circuit 400 will be illustrated in more details.

Figure 3A:
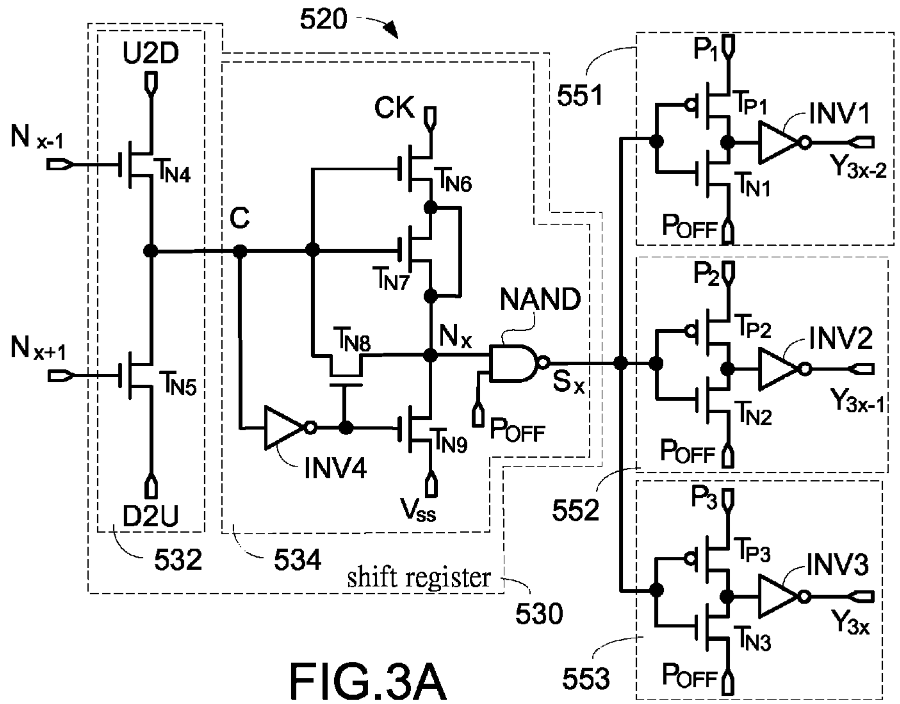
FIG. 3A is a schematic circuit diagram illustrating a first example of the x-th driving module of the multiplex gate driving circuit according to an embodiment.
Figure 3B:
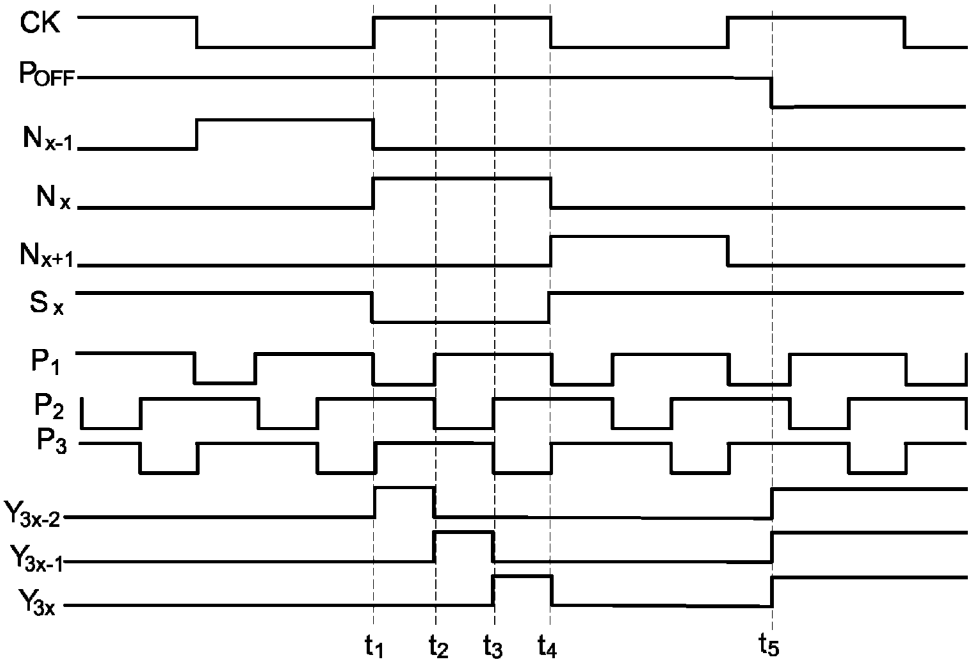
FIG. 3B is a schematic timing waveform diagram illustrating associated signal processed by the x-th driving module of FIG. 3A.

FIG. 3A is a schematic circuit diagram illustrating a first example of the x-th driving module of the multiplex gate driving circuit according to an embodiment. FIG. 3B is a schematic timing waveform diagram illustrating associated signal processed by the x-th driving module of FIG. 3A. In this embodiment, the master signal is a negative pulse, and each of the slave signals includes plural negative pulses.

The x-th driving module 520 comprises a shift register 530 and three driving stages 551~55*n* (n=3). The shift register 530 comprises a bidirectional input circuit 532 and a shift unit 534. Since the x-th driving module 520 has three driving stages, three slave signals $P_1$~$P_3$ are respectively received by the three driving stages. It is noted that if the x-th driving module 520 has n driving stages, n slave signals are respectively received by the n driving stages.

The first driving stage 551 comprises a transistor $T_{P1}$, a transistor $T_{N1}$ and an inverter INV1. The first slave signal $P_1$ is received by the source terminal of the transistor $T_{P1}$. The x-th master signal $S_x$ is received by the gate terminal of the transistor $T_{P1}$. The drain terminal of the transistor $T_{N1}$ is connected with the drain terminal of the transistor $T_{P1}$. The x-th master signal $S_x$ is also received by the gate terminal of the transistor $T_{N1}$. The power-off control signal $P_{OFF}$ is received by the source terminal of the transistor $T_{N1}$. An input terminal of the inverter INV1 is connected with the drain terminal of the transistor $T_{P1}$. The gate driving signal $Y_{3x-2}$ is outputted from an output terminal of the inverter INV1. Similarly, the second slave signal $P_2$ is received by the second driving stage 552, and the third slave signal $P_3$ is received by the third driving stage 553. The connecting relationship is not redundantly described herein.

The bidirectional input circuit 532 comprises a transistor $T_{N4}$ and a transistor $T_{N5}$. A first voltage U2D (e.g. a high logic-level voltage) is received by the drain terminal of the transistor $T_{N4}$. The (x−1)-th notification signal $N_{x-1}$ from the (x−1)-th driving module (not shown) is received by the gate terminal of the transistor $T_{N4}$. The drain terminal of the transistor $T_{N5}$ is connected with the source terminal of the transistor $T_{N4}$. The (x+1)-th notification signal $N_{x+1}$ from the (x+1)-th driving module (not shown) is received by the gate terminal of the transistor $T_{N5}$. A second voltage D2U (e.g. a low logic-level voltage) is received by the source terminal of the transistor $T_{N5}$. Moreover, a control signal C is outputted from the source terminal of the transistor $T_{N4}$. Obviously, if the (x−1)-th notification signal $N_{x-1}$ is in the high level state, the control signal C is in the high level state; but if the (x+1)-th notification signal $N_{x+1}$ is in the high level state, the control signal C is in the low level state.

The shift unit 534 comprises a transistor $T_{N6}$, a transistor $T_{N7}$, a transistor $T_{N8}$, a transistor $T_{N9}$, a NAND gate and an inverter INV4. The control signal C is received by the gate terminal of the transistor $T_{N6}$. A clock signal CK is received by the drain terminal of the transistor $T_{N6}$. The control signal C is received by the gate terminal of the transistor $T_{N7}$. The source terminal and the drain terminal of the transistor $T_{N7}$ are connected to the source terminal of the transistor $T_{N6}$. The control signal C is also received by the drain terminal of the transistor $T_{N8}$. The source terminal of the transistor $T_{N8}$ is connected with the source terminal of the transistor $T_{N7}$. The drain terminal of the transistor $T_{N9}$ is connected with the source terminal of the transistor $T_{N7}$. A third voltage $V_{ss}$ (e.g. a low logic-level voltage) is received by the source terminal of the transistor $T_{N9}$. The control signal C is also received by the input terminal of the inverter INV4. The output terminal of the inverter INV4 is connected with the gate terminal of the transistor $T_{N8}$ and gate terminal of the transistor $T_{N9}$. A first input terminal of the NAND gate is connected with the source terminal of the transistor $T_{N7}$. The power-off control signal $P_{OFF}$ is received by a second input terminal of the NAND gate. The x-th master signal $S_x$ is outputted from the output terminal of the NAND gate. Moreover, the x-th notification signal $N_x$ is outputted from the source terminal of the transistor $T_{N7}$.

Please refer to FIG. 3B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the low level state. From the time spot t1 to the time spot t2, the x-th master signal $S_x$ is in the low level state, and the first slave signal $P_1$ is in the low level state. Consequently, the gate driving signal $Y_{3x-2}$ is in the high level state. From the time spot t2 to the time spot t3, the x-th master signal $S_x$ is in the low level state, and the second slave signal $P_2$ is in the low level state. Consequently, the gate driving signal $Y_{3x-1}$ is in the high level state. From the time spot t3 to the time spot t4, the x-th master signal $S_x$ is in the low level state, and the third slave signal $P_3$ is in the low level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-2}$ and $Y_{3x}$ are switched to the high level state. Consequently, no image sticking phenomenon occurs in the thin film transistor array of the visible zone of the conventional LCD panel.

Figure 4A:
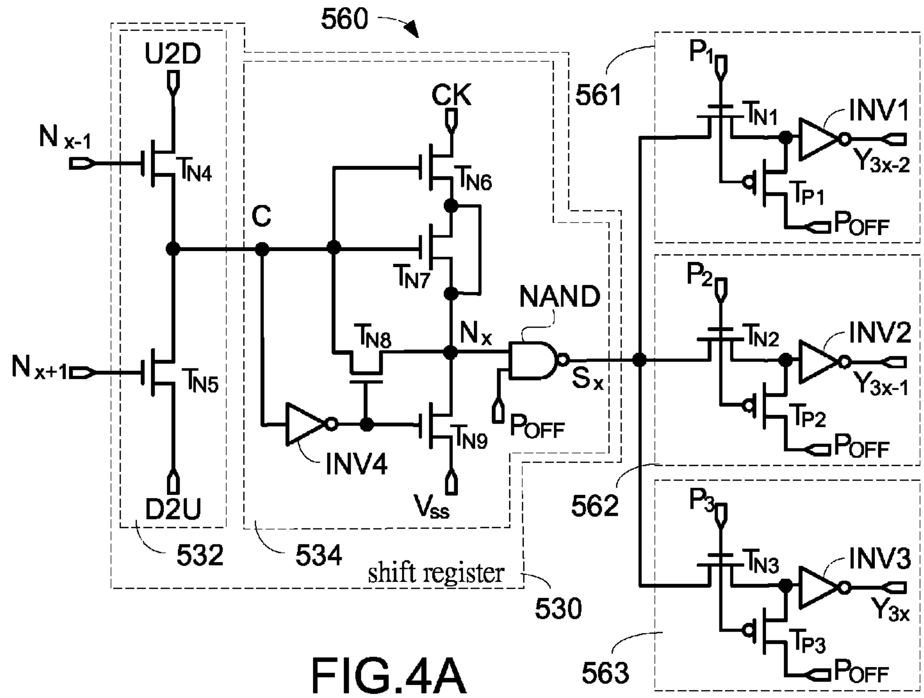
FIG. 4A is a schematic circuit diagram illustrating a second example of the x-th driving module of the multiplex gate driving circuit according to an embodiment.
Figure 4B:
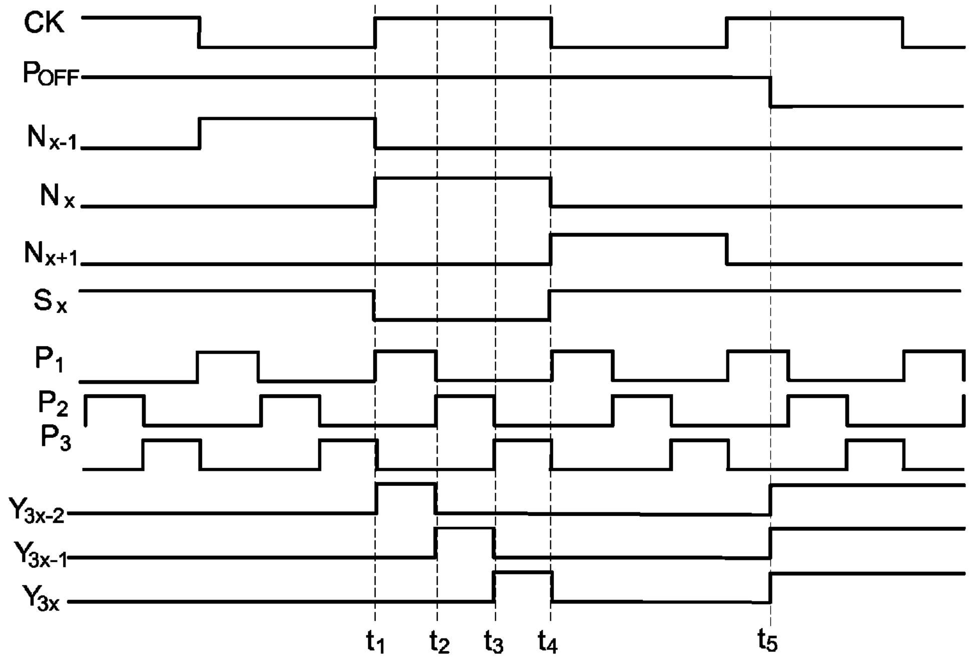
FIG. 4B is a schematic timing waveform diagram illustrating associated signal processed by the x-th driving module of FIG. 4A.

FIG. 4A is a schematic circuit diagram illustrating a second example of the x-th driving module of the multiplex gate driving circuit according to an embodiment. FIG. 4B is a schematic timing waveform diagram illustrating associated signal processed by the x-th driving module of FIG. 4A. In this embodiment, the master signal is a negative pulse, and each of the slave signals includes plural positive pulses.

The x-th driving module 560 comprises a shift register 530 and three driving stages 561~56*n* (n=3). The shift register 530 is identical to that of the first example, and is not redundantly described herein. Since the x-th driving module 560 has three driving stages, three slave signals $P_1$~$P_3$ are respectively received by the three driving stages. It is noted that if the x-th driving module 560 has n driving stages, n slave signals are respectively received by the n driving stages.

The first driving stage 561 comprises a transistor $T_{P1}$, a transistor $T_{N1}$ and an inverter INV1. The first slave signal $P_1$ is received by the gate terminal of the transistor $T_{N1}$. The x-th master signal $S_x$ is received by the drain terminal of the transistor $T_{N1}$. The source terminal of the transistor $T_{P1}$ is connected with the source terminal of the transistor $T_{N1}$. The first slave signal $P_1$ is also received by the gate terminal of the transistor $T_{P1}$. The power-off control signal $P_{OFF}$ is received by the drain terminal of the transistor $T_{P1}$. An input terminal of the inverter INV1 is connected with the source terminal of the transistor $T_{P1}$. The gate driving signal $Y_{3x-2}$ is outputted from an output terminal of the inverter INV1. Similarly, the second slave signal $P_2$ is received by the second driving stage 562, and the third slave signal $P_3$ is received by the third driving stage 563. The connecting relationship is not redundantly described herein.

Please refer to FIG. 4B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the low level state. From the time spot t1 to the time spot t2, the x-th master signal $S_x$ is in the low level state, and the first slave signal $P_1$ is in the high level state. Consequently, the gate driving signal $Y_{3x-2}$ is in the high level state. From the time spot t2 to the time spot t3, the x-th master signal $S_x$ is in the low level state, and the second slave signal $P_2$ is in the high level state. Consequently, the gate driving signal $Y_{3x-1}$ is in the high level state. From the time spot t3 to the time spot t4, the x-th master signal $S_x$ is in the low level state, and the third slave signal $P_3$ is in the high level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 5A:
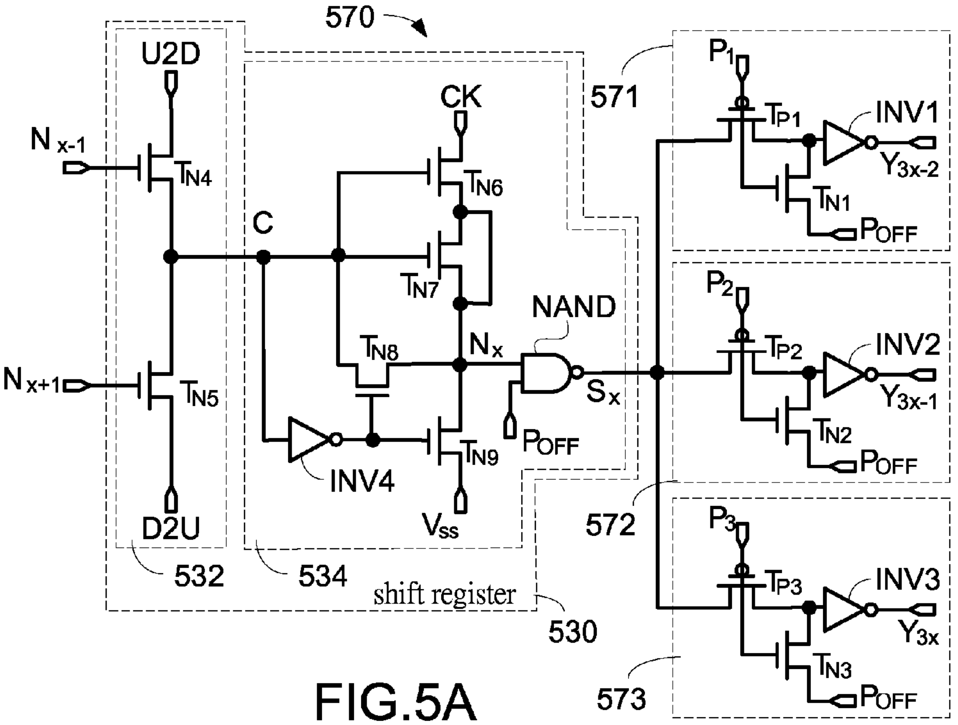
FIG. 5A is a schematic circuit diagram illustrating a third example of the x-th driving module of the multiplex gate driving circuit according to an embodiment.
Figure 5B:
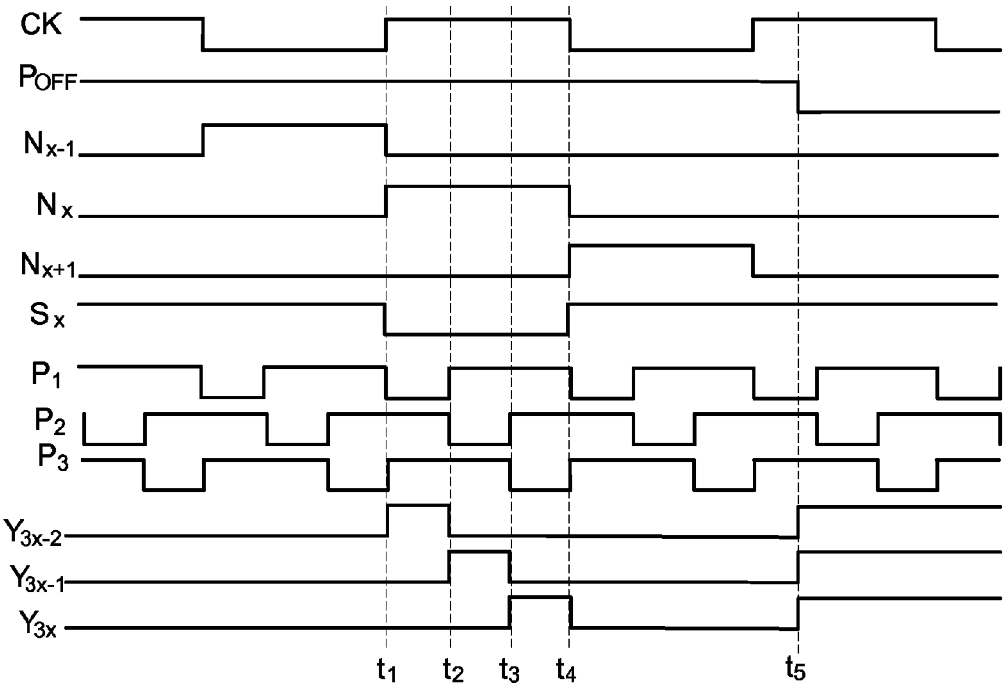
FIG. 5B is a schematic timing waveform diagram illustrating associated signal processed by the x-th driving module of FIG. 5A.

FIG. 5A is a schematic circuit diagram illustrating a third example of the x-th driving module of the multiplex gate driving circuit according to an embodiment. FIG. 5B is a schematic timing waveform diagram illustrating associated signal processed by the x-th driving module of FIG. 5A. In this embodiment, the master signal is a negative pulse, and each of the slave signals includes plural negative pulses.

The x-th driving module 570 comprises a shift register 530 and three driving stages 571~57*n* (n=3). The shift register 530 is identical to that of the first example, and is not redundantly described herein. Since the x-th driving module 570 has three driving stages, three slave signals $P_1$~$P_3$ are respectively received by the three driving stages. It is noted that if the x-th driving module 570 has n driving stages, n slave signals are respectively received by the n driving stages.

The first driving stage 571 comprises a transistor $T_{P1}$, a transistor $T_{N1}$ and an inverter INV1. The first slave signal $P_1$ is received by the gate terminal of the transistor $T_{P1}$. The x-th master signal $S_x$ is received by the source terminal of the transistor $T_{P1}$. The drain terminal of the transistor $T_{N1}$ is connected with the drain terminal of the transistor $T_{P1}$. The first slave signal $P_1$ is also received by the gate terminal of the transistor $T_{N1}$. The power-off control signal $P_{OFF}$ is received by the source terminal of the transistor $T_{N1}$. An input terminal of the inverter INV1 is connected with the drain terminal of the transistor $T_{P1}$. The gate driving signal $Y_{3x-2}$ is outputted from an output terminal of the inverter INV1. Similarly, the second slave signal $P_2$ is received by the second driving stage 572, and the third slave signal $P_3$ is received by the third driving stage 573. The connecting relationship is not redundantly described herein.

Please refer to FIG. 5B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the low level state. From the time spot t1 to the time spot t2, the x-th master signal $S_x$ is in the low level state, and the first slave signal $P_1$ is in the high level state. Consequently, the gate driving signal $Y_{3x-2}$ is in the high level state. From the time spot t2 to the time spot t3, the x-th master signal $S_x$ is in the low level state, and the second slave signal $P_2$ is in the low level state. Consequently, the gate driving signal $Y_{3x-1}$ is in the high level state. From the time spot t3 to the time spot t4, the x-th master signal $S_x$ is in the low level state, and the third slave signal $P_3$ is in the low level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 6A:
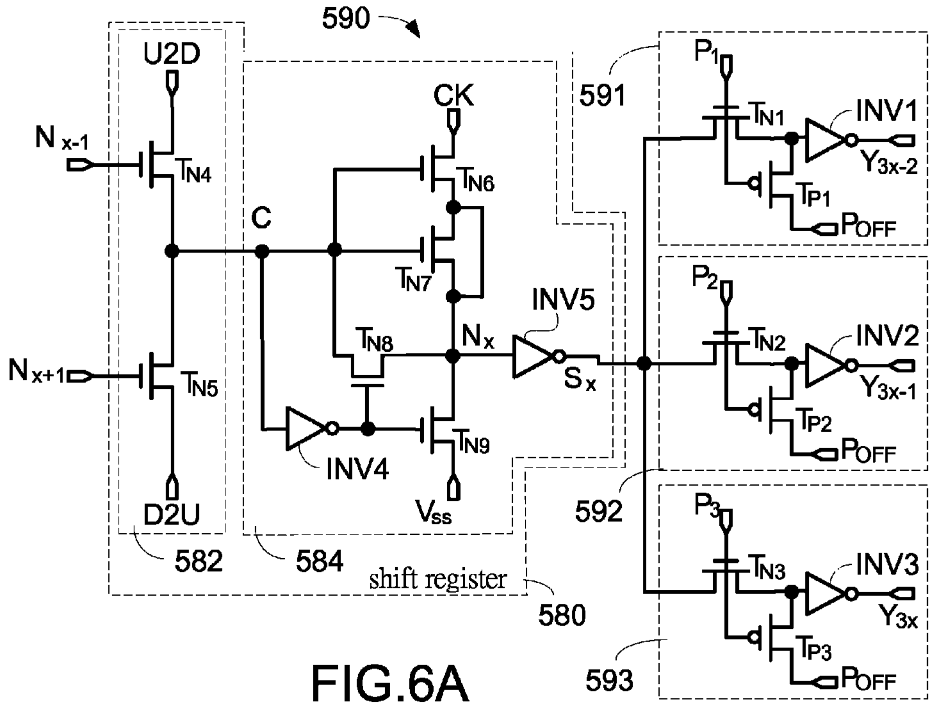
FIG. 6A is a schematic circuit diagram illustrating a fourth example of the x-th driving module of the multiplex gate driving circuit according to an embodiment.
Figure 6B:
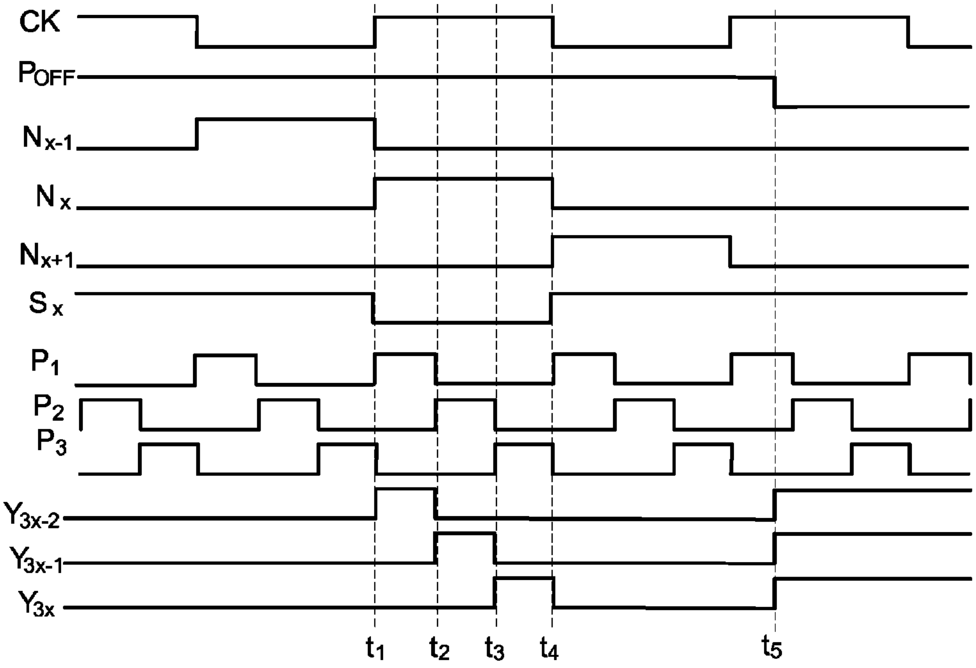
FIG. 6B is a schematic timing waveform diagram illustrating associated signal processed by the x-th driving module of FIG. 6A.

FIG. 6A is a schematic circuit diagram illustrating a fourth example of the x-th driving module of the multiplex gate driving circuit according to an embodiment. FIG. 6B is a schematic timing waveform diagram illustrating associated signal processed by the x-th driving module of FIG. 6A. In this embodiment, the master signal is a negative pulse, and each of the slave signals includes plural positive pulses.

The x-th driving module 590 comprises a shift register 580 and three driving stages 591~**59*n* (n=3). The shift register 580 comprises a bidirectional input circuit 582 and a shift unit 584. Since the x-th driving module 590 has three driving stages, three slave signals $P_1$~$P_3$ are respectively received by the three driving stages. It is noted that if the x-th driving module 590** has n driving stages, n slave signals are respectively received by the n driving stages.

The first driving stage 591 comprises a transistor $T_{P1}$, a transistor $T_{N1}$ and an inverter INV1. The first slave signal $P_1$ is received by the gate terminal of the transistor $T_{N1}$. The x-th master signal $S_x$ is received by the drain terminal of the transistor $T_{N1}$. The source terminal of the transistor $T_{P1}$ is connected with the source terminal of the transistor $T_{N1}$. The first slave signal $P_1$ is also received by the gate terminal of the transistor $T_{P1}$. The power-off control signal $P_{OFF}$ is received by the drain terminal of the transistor $T_{P1}$. An input terminal of the inverter INV1 is connected with the source terminal of the transistor $T_{P1}$. The gate driving signal $Y_{3x-2}$ is outputted from an output terminal of the inverter INV1. Similarly, the second slave signal $P_2$ is received by the second driving stage 592, and the third slave signal $P_3$ is received by the third driving stage 593. The connecting relationship is not redundantly described herein.

The bidirectional input circuit 582 comprises a transistor $T_{N4}$ and a transistor $T_{N5}$. A first voltage U2D (e.g. a high logic-level voltage) is received by the drain terminal of the transistor $T_{N4}$. The (x−1)-th notification signal $N_{x-1}$ from the (x−1)-th driving module (not shown) is received by the gate terminal of the transistor $T_{N4}$. The drain terminal of the transistor $T_{N5}$ is connected with the source terminal of the transistor $T_{N4}$. The (x+1)-th notification signal $N_{x+1}$ from the (x+1)-th driving module (not shown) is received by the gate terminal of the transistor $T_{N5}$. A second voltage D2U (e.g. a low logic-level voltage) is received by the source terminal of the transistor $T_{N5}$. Moreover, a control signal C is outputted from the source terminal of the transistor $T_{N4}$. Obviously, if the (x−1)-th notification signal $N_{x-1}$ is in the high level state, the control signal C is in the high level state; but if the (x+1)-th notification signal $N_{x+1}$ is in the high level state, the control signal C is in the low level state.

The shift unit 584 comprises a transistor $T_{N6}$, a transistor $T_{N7}$, a transistor $T_{N8}$, a transistor $T_{N9}$, an inverter INV4 and an inverter INV5. The control signal C is received by the gate terminal of the transistor $T_{N6}$. A clock signal CK is received by the drain terminal of the transistor $T_{N6}$. The control signal C is received by the gate terminal of the transistor $T_{N7}$. The source terminal and the drain terminal of the transistor $T_{N7}$ are connected to the source terminal of the transistor $T_{N6}$. The control signal C is also received by the drain terminal of the transistor $T_{N8}$. The source terminal of the transistor $T_{N8}$ is connected with the source terminal of the transistor $T_{N7}$. The drain terminal of the transistor $T_{N9}$ is connected with the source terminal of the transistor $T_{N7}$. A third voltage $V_{ss}$ (e.g. a low logic-level voltage) is received by the source terminal of the transistor $T_{N9}$. The control signal C is also received by the input terminal of the inverter INV4. The output terminal of the inverter INV4 is connected with the gate terminal of the transistor $T_{N8}$ and gate terminal of the transistor $T_{N9}$. The input terminal of the inverter INV5 is connected with the source terminal of the transistor $T_{N7}$. The x-th master signal $S_x$ is outputted from the output terminal of the inverter INV5. Moreover, the x-th notification signal $N_x$ is outputted from the source terminal of the transistor $T_{N7}$.

Please refer to FIG. 6B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the low level state. From the time spot t1 to the time spot t2, the x-th master signal $S_x$ is in the low level state, and the first slave signal $P_1$ is in the high level state. Consequently, the gate driving signal $Y_{3x-2}$ is in the high level state. From the time spot t2 to the time spot t3, the x-th master signal $S_x$ is in the low level state, and the second slave signal $P_2$ is in the high level state. Consequently, the gate driving signal $Y_{3x-1}$ is in the high level state. From the time spot t3 to the time spot t4, the x-th master signal $S_x$ is in the low level state, and the third slave signal $P_3$ is in the high level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 7A:
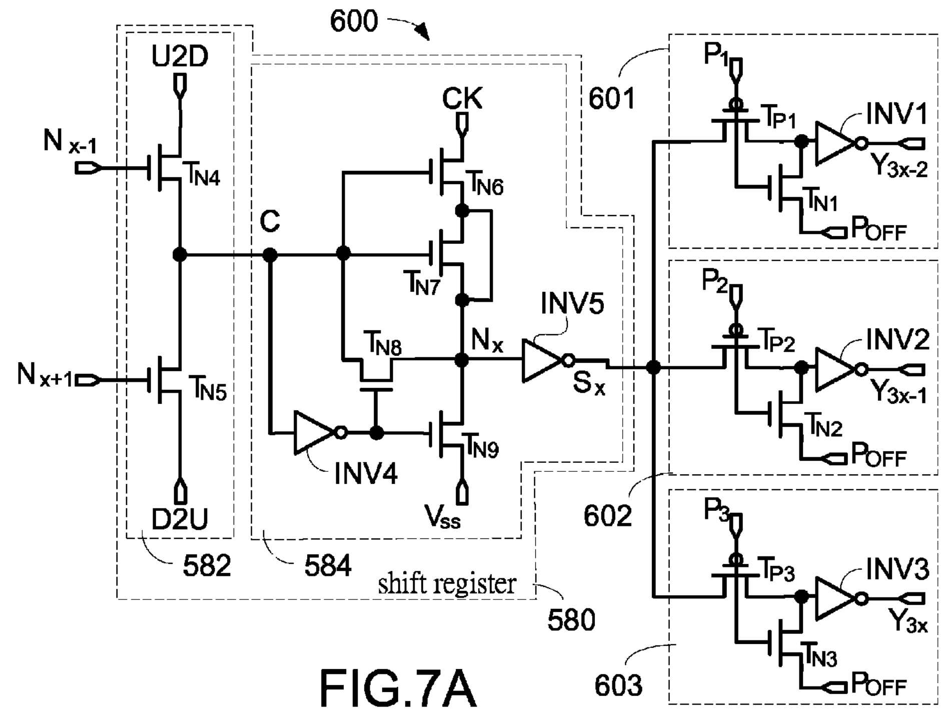
FIG. 7A is a schematic circuit diagram illustrating a fifth example of the x-th driving module of the multiplex gate driving circuit according to an embodiment.
Figure 7B:
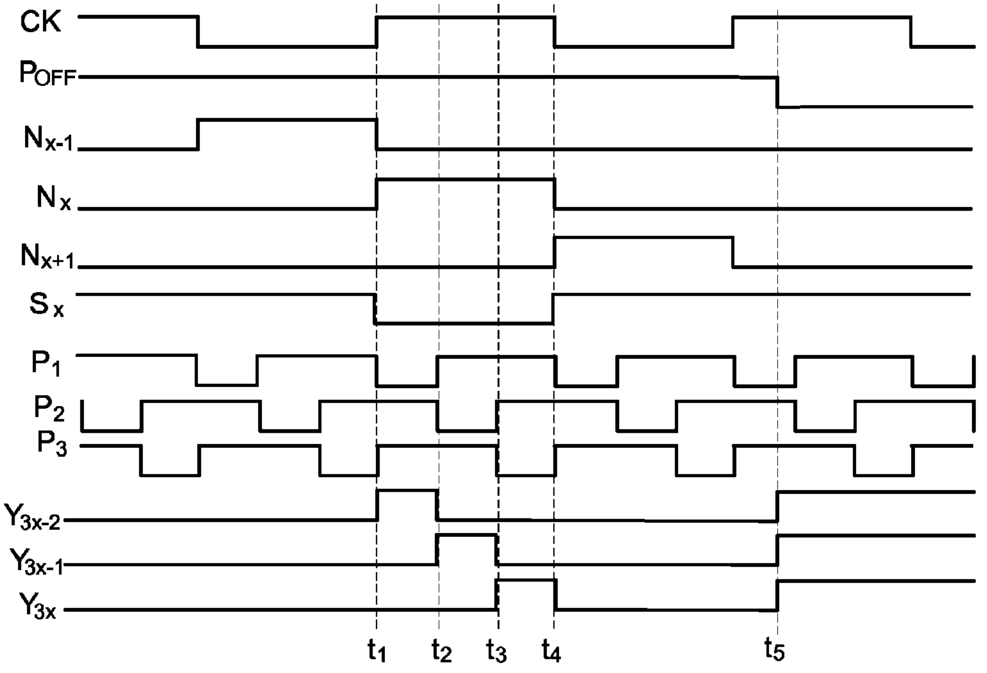
FIG. 7B is a schematic timing waveform diagram illustrating associated signal processed by the x-th driving module of FIG. 7A.

FIG. 7A is a schematic circuit diagram illustrating a fifth example of the x-th driving module of the multiplex gate driving circuit according to an embodiment. FIG. 7B is a schematic timing waveform diagram illustrating associated signal processed by the x-th driving module of FIG. 7A. In this embodiment, the master signal is a negative pulse, and each of the slave signals includes plural negative pulses.

The x-th driving module 600 comprises a shift register 580 and three driving stages 601~**60*n* (n=3). The shift register 580 is identical to that of the fourth example, and is not redundantly described herein. Since the x-th driving module 600 has three driving stages, three slave signals $P_1$~$P_3$ are respectively received by the three driving stages. It is noted that if the x-th driving module 600** has n driving stages, n slave signals are respectively received by the n driving stages.

The first driving stage 601 comprises a transistor $T_{P1}$, a transistor $T_{N1}$ and an inverter INV1. The first slave signal $P_1$ is received by the gate terminal of the transistor $T_{P1}$. The x-th master signal $S_x$ is received by the source terminal of the transistor $T_{P1}$. The drain terminal of the transistor $T_{N1}$ is connected with the drain terminal of the transistor $T_{P1}$. The first slave signal $P_1$ is also received by the gate terminal of the transistor $T_{N1}$. The power-off control signal $P_{OFF}$ is received by the source terminal of the transistor $T_{N1}$. An input terminal of the inverter INV1 is connected with the drain terminal of the transistor $T_{P1}$. The gate driving signal $Y_{3x-2}$ is outputted from an output terminal of the inverter INV1. Similarly, the second slave signal $P_2$ is received by the second driving stage 602, and the third slave signal $P_3$ is received by the third driving stage 603. The connecting relationship is not redundantly described herein.

Please refer to FIG. 7B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the low level state. From the time spot t1 to the time spot t2, the x-th master signal $S_x$ is in the low level state, and the first slave signal $P_1$ is in the high level state. Consequently, the gate driving signal $Y_{3x-2}$ is in the high level state. From the time spot t2 to the time spot t3, the x-th master signal $S_x$ is in the low level state, and the second slave signal $P_2$ is in the low level state. Consequently, the gate driving signal $Y_{3x-1}$ is in the high level state. From the time spot t3 to the time spot t4, the x-th master signal $S_x$ is in the low level state, and the third slave signal $P_3$ is in the low level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 8A:
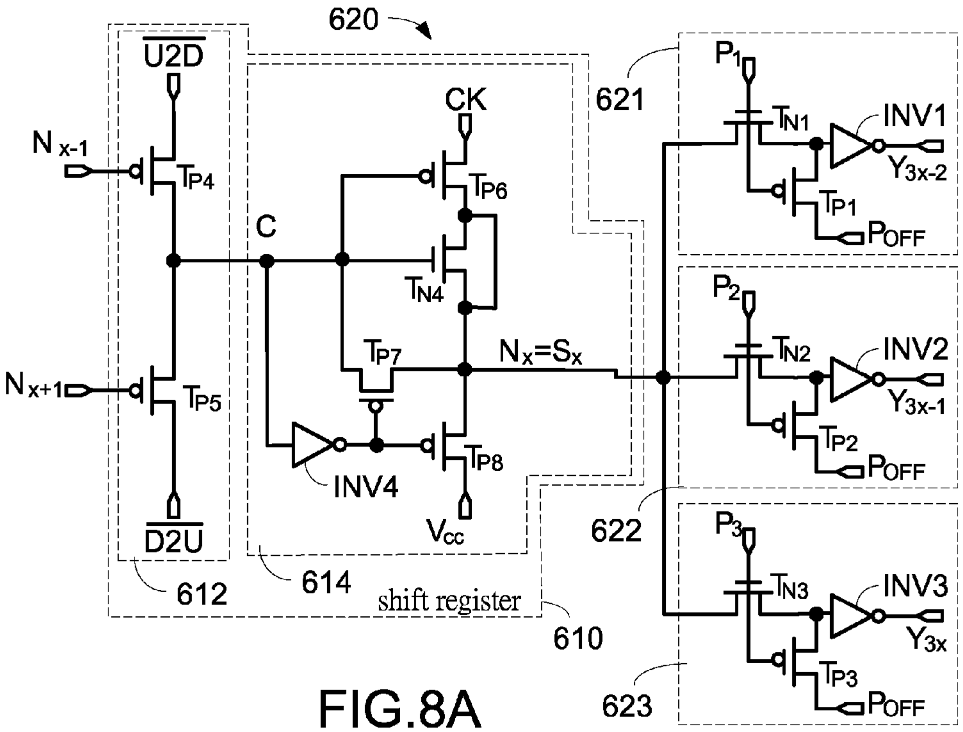
FIG. 8A is a schematic circuit diagram illustrating a sixth example of the x-th driving module of the multiplex gate driving circuit according to an embodiment.
Figure 8B:
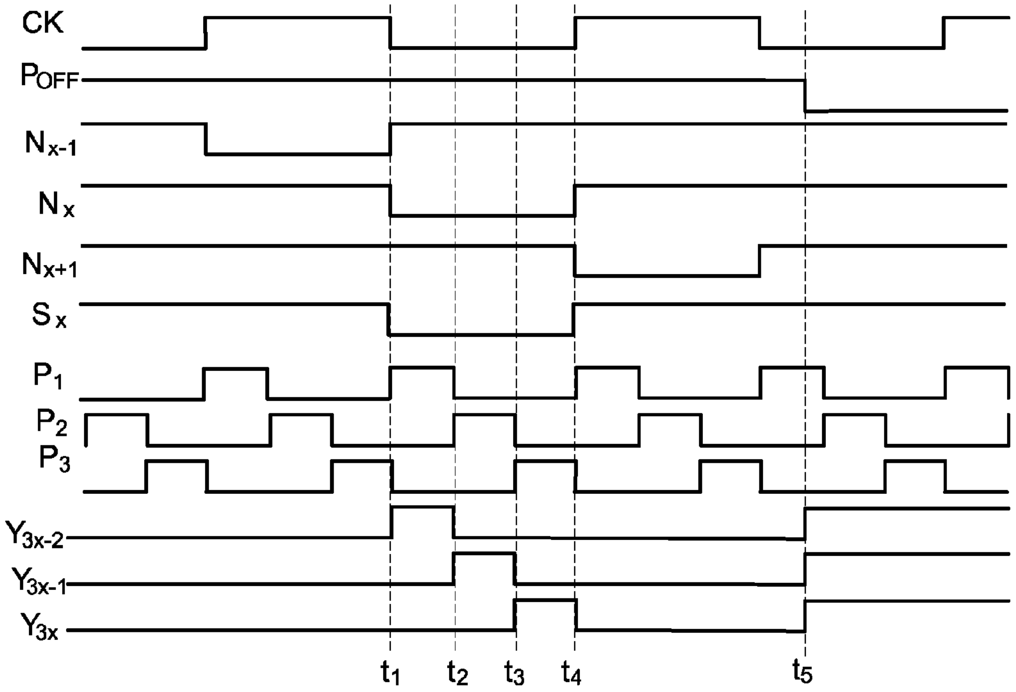
FIG. 8B is a schematic timing waveform diagram illustrating associated signal processed by the x-th driving module of FIG. 8A.

FIG. 8A is a schematic circuit diagram illustrating a sixth example of the x-th driving module of the multiplex gate driving circuit according to an embodiment. FIG. 8B is a schematic timing waveform diagram illustrating associated signal processed by the x-th driving module of FIG. 8A. In this embodiment, the master signal is a positive pulse, and each of the slave signals includes plural positive pulses.

The x-th driving module 620 comprises a shift register 610 and three driving stages 621~62*n* (n=3). The shift register 610 comprises a bidirectional input circuit 612 and a shift unit 614. Since the x-th driving module 620 has three driving stages, three slave signals $P_1$~$P_3$ are respectively received by the three driving stages. It is noted that if the x-th driving module 620 has n driving stages, n slave signals are respectively received by the n driving stages.

The first driving stage 621 comprises a transistor $T_{P1}$, a transistor $T_{N1}$ and an inverter INV1. The first slave signal $P_1$ is received by the gate terminal of the transistor $T_{N1}$. The x-th master signal $S_x$ is received by the drain terminal of the transistor $T_{N1}$. The source terminal of the transistor $T_{P1}$ is connected with the source terminal of the transistor $T_{N1}$. The first slave signal $P_1$ is also received by the gate terminal of the transistor $T_{P1}$. The power-off control signal $P_{OFF}$ is received by the drain terminal of the transistor $T_{P1}$. An input terminal of the inverter INV1 is connected with the source terminal of the transistor $T_{P1}$. The gate driving signal $Y_{3x-2}$ is outputted from an output terminal of the inverter INV1. Similarly, the second slave signal $P_2$ is received by the second driving stage 622, and the third slave signal $P_3$ is received by the third driving stage 623. The connecting relationship is not redundantly described herein.

The bidirectional input circuit 612 comprises a transistor $T_N$ and a transistor $T_{P5}$. A first voltage $\overline{U2D}$ (e.g. a low logic-level voltage) is received by the source terminal of the transistor $T_N$. The (x−1)-th notification signal $N_{x-1}$ from the (x−1)-th driving module (not shown) is received by the gate terminal of the transistor $T_N$. The source terminal of the transistor $T_{P5}$ is connected with the drain terminal of the transistor $T_{N4}$. The (x+1)-th notification signal $N_{x+1}$ from the (x+1)-th driving module (not shown) is received by the gate terminal of the transistor $T_{P5}$. A second voltage $\overline{D2U}$ (e.g. a high logic-level voltage) is received by the drain terminal of the transistor $T_{P5}$. Moreover, a control signal C is outputted from the drain terminal of the transistor $T_{P4}$. Obviously, if the (x−1)-th notification signal $N_{x-1}$ is in the low level state, the control signal C is in the low level state; but if the (x+1)-th notification signal $N_{x+1}$ is in the low level state, the control signal C is in the high level state.

The shift unit 614 comprises a transistor $T_{N4}$, a transistor $T_{P6}$, a transistor $T_{P7}$, a transistor $T_{P8}$ and an inverter INV4. The control signal C is received by the gate terminal of the transistor $T_{P6}$. A clock signal CK is received by the source terminal of the transistor $T_{P6}$. The control signal C is also received by the gate terminal of the transistor $T_{N4}$. The source terminal and the drain terminal of the transistor $T_{N4}$ are connected to the drain terminal of the transistor $T_{P6}$. The control signal C is also received by the source terminal of the transistor $T_{P7}$. The drain terminal of the transistor $T_{P7}$ is connected with the source terminal of the transistor $T_{N4}$. The source terminal of the transistor $T_{P8}$ is connected with the source terminal of the transistor $T_{N4}$. A third voltage $V_{cc}$ (e.g. a high logic-level voltage) is received by the drain terminal of the transistor $T_{P8}$. The control signal C is also received by the input terminal of the inverter INV4. The output terminal of the inverter INV4 is connected with the gate terminal of the transistor $T_{P7}$ and gate terminal of the transistor $T_{P8}$. Moreover, the x-th notification signal $N_x$ and the x-th master signal $S_x$ that have the same voltage level are outputted from the source terminal of the transistor $T_{N4}$.

Please refer to FIG. 8B. At the time spot t1, the (x−1)-th notification signal $N_{x-1}$ is in the low level state, and the clock signal CK is switched to the low level state. Consequently, the x-th notification signal $N_x$ is in the low level state, and x-th master signal $S_x$ is in the low level state. From the time spot t1 to the time spot t2, the x-th master signal $S_x$ is in the low level state, and the first slave signal $P_1$ is in the high level state. Consequently, the gate driving signal $Y_{3x-2}$ is in the high level state. From the time spot t2 to the time spot t3, the x-th master signal $S_x$ is in the low level state, and the second slave signal $P_2$ is in the high level state. Consequently, the gate driving signal $Y_{3x-1}$ is in the high level state. From the time spot t3 to the time spot t4, the x-th master signal $S_x$ is in the low level state, and the third slave signal $P_3$ is in the high level state. Consequently, the gate driving signal $Y_{3x}$ is in the high level state. At the time spot t4, the (x+1)-th notification signal $N_{x+1}$ is in the low level state. Consequently, the x-th notification signal $N_x$ is in the high level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 9A:
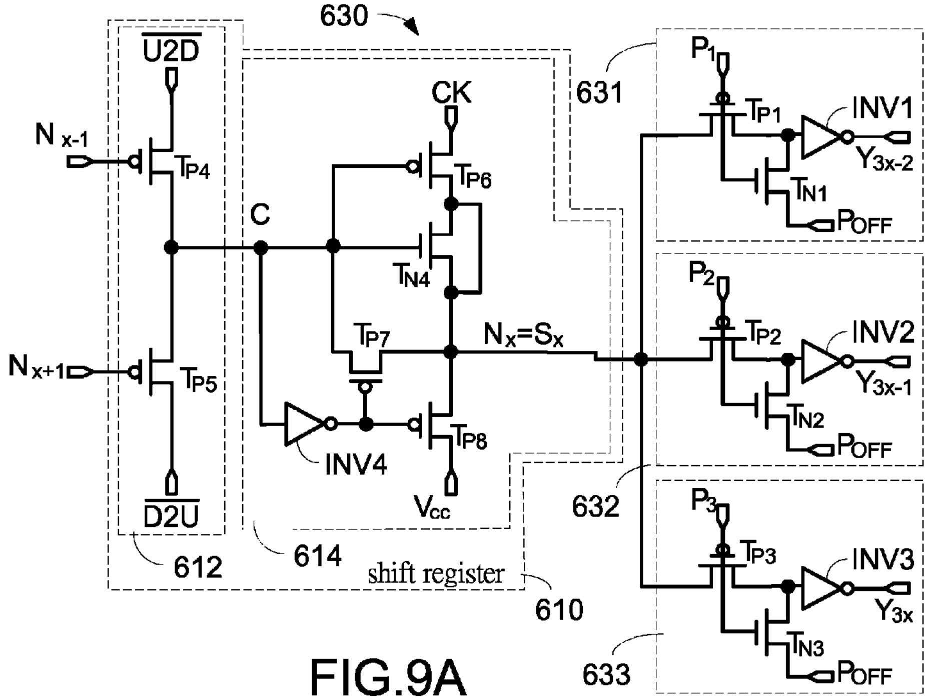
FIG. 9A is a schematic circuit diagram illustrating a seventh example of the x-th driving module of the multiplex gate driving circuit according to an embodiment.
Figure 9B:
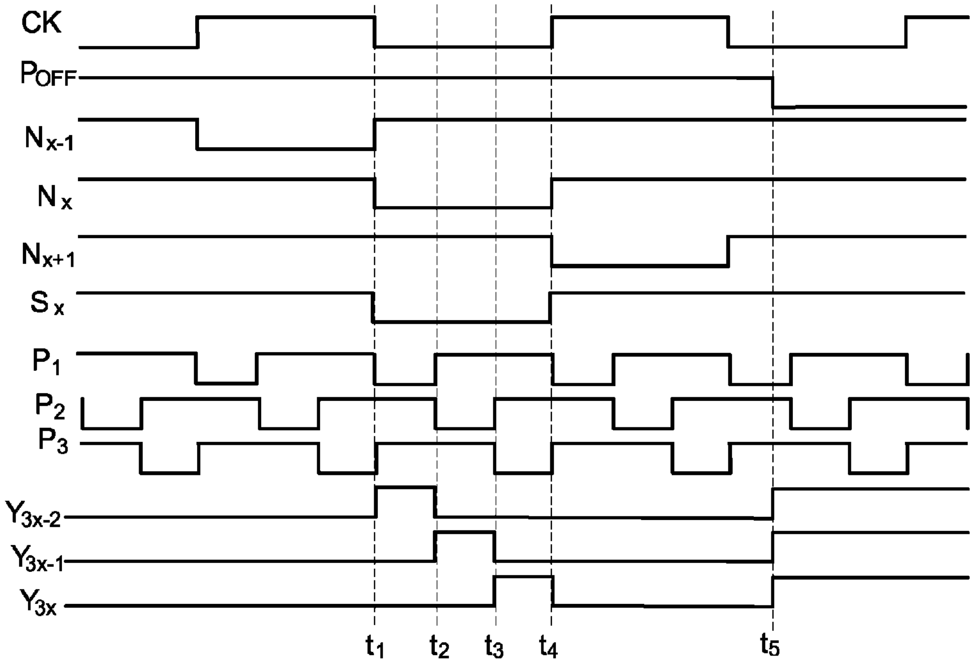
FIG. 9B is a schematic timing waveform diagram illustrating associated signal processed by the x-th driving module of FIG. 9A.

FIG. 9A is a schematic circuit diagram illustrating a seventh example of the x-th driving module of the multiplex gate driving circuit according to an embodiment. FIG. 9B is a schematic timing waveform diagram illustrating associated signal processed by the x-th driving module of FIG. 9A. In this embodiment, the master signal is a negative pulse, and each of the slave signals includes plural negative pulses.

The x-th driving module 630 comprises a shift register 610 and three driving stages 631~63*n* (n=3). The shift register 610 is identical to that of the sixth example, and is not redundantly described herein. Since the x-th driving module 630 has three driving stages, three slave signals $P_1$~$P_3$ are respectively received by the three driving stages. It is noted that if the x-th driving module 630 has n driving stages, n slave signals are respectively received by the n driving stages.

The first driving stage 631 comprises a transistor $T_{P1}$, a transistor $T_{N1}$ and an inverter INV1. The first slave signal $P_1$ is received by the gate terminal of the transistor $T_{P1}$. The x-th master signal $S_x$ is received by the source terminal of the transistor $T_{P1}$. The drain terminal of the transistor $T_{N1}$ is connected with the drain terminal of the transistor $T_{P1}$. The first slave signal $P_1$ is also received by the gate terminal of the transistor $T_{N1}$. The power-off control signal $P_{OFF}$ is received by the source terminal of the transistor $T_{N1}$. An input terminal of the inverter INV1 is connected with the drain terminal of the transistor $T_{P1}$. The gate driving signal $Y_{3x-2}$ is outputted from an output terminal of the inverter INV1. Similarly, the second slave signal $P_2$ is received by the second driving stage 632, and the third slave signal $P_3$ is received by the third driving stage 633. The connecting relationship is not redundantly described herein.

Please refer to FIG. 9B. At the time spot t1, the (x−1)-th notification signal $N_{x-1}$ is in the low level state, and the clock signal CK is switched to the low level state. Consequently, the x-th notification signal $N_x$ is in the low level state, and x-th master signal $S_x$ is in the low level state. From the time spot t1 to the time spot t2, the x-th master signal $S_x$ is in the low level state, and the first slave signal $P_1$ is in the low level state. Consequently, the gate driving signal $Y_{3x-2}$ is in the high level state. From the time spot t2 to the time spot t3, the x-th master signal $S_x$ is in the low level state, and the second slave signal $P_2$ is in the low level state. Consequently, the gate driving signal $Y_{3x-1}$ is in the high level state. From the time spot t3 to the time spot t4, the x-th master signal $S_x$ is in the low level state, and the third slave signal $P_3$ is in the low level state. Consequently, the gate driving signal $Y_{3x}$ is in the high level state. At the time spot t4, the (x+1)-th notification signal $N_{x+1}$ is in the low level state. Consequently, the x-th notification signal $N_x$ is in the high level state, and the x-th master signal $S_x$ is in the high level state.

Moreover, at an arbitrary time spot t5 when the power-off control signal $P_{OFF}$ is changed from the high level state to the low level state, all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 10A:
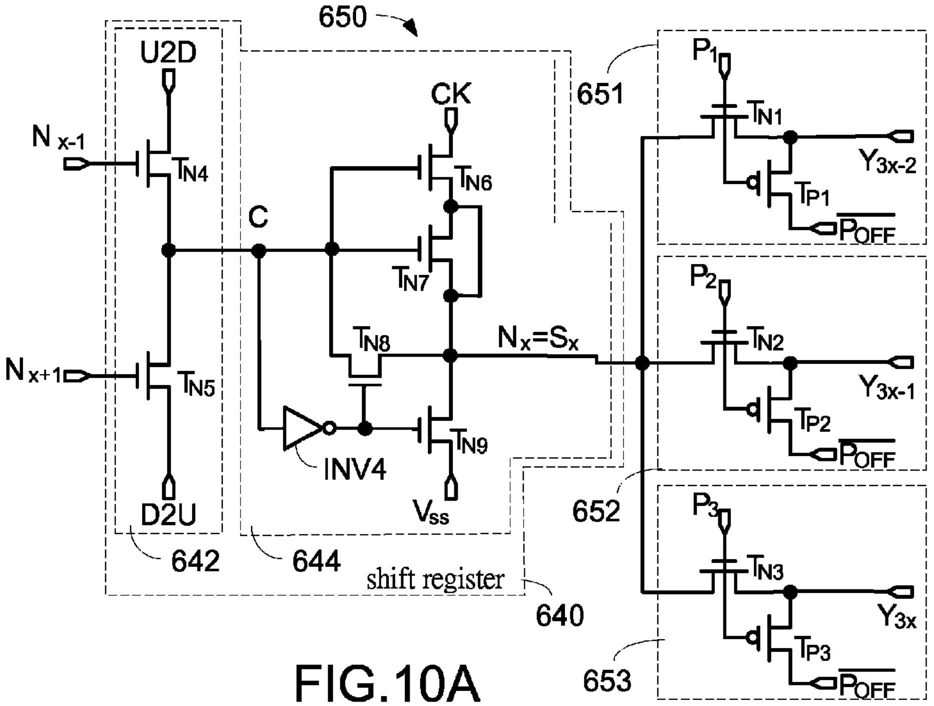
FIG. 10A is a schematic circuit diagram illustrating an eighth example of the x-th driving module of the multiplex gate driving circuit according to an embodiment.
Figure 10B:
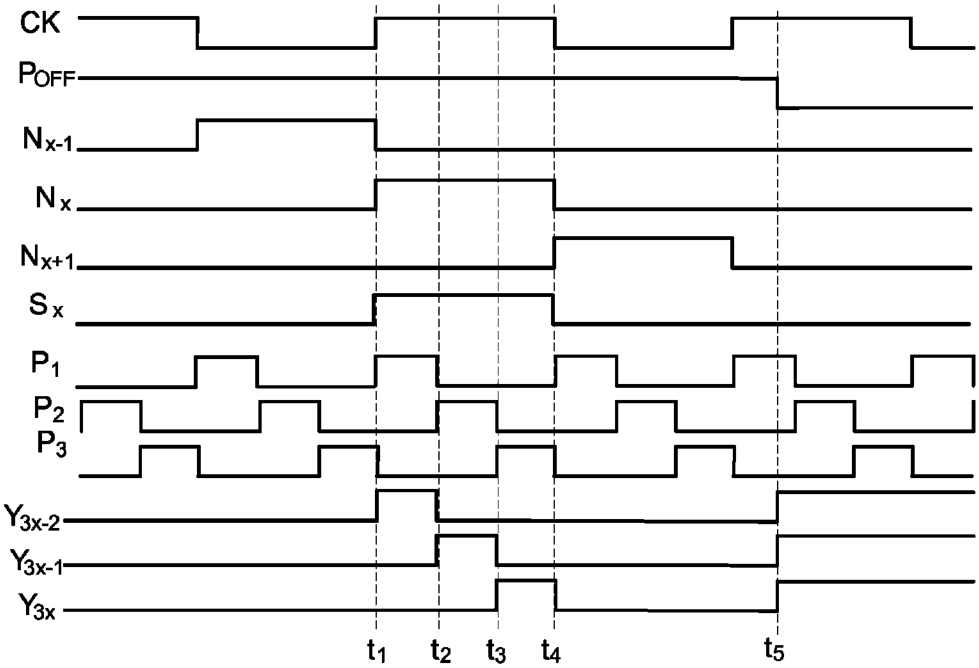
FIG. 10B is a schematic timing waveform diagram illustrating associated signal processed by the x-th driving module of FIG. 10A.

FIG. 10A is a schematic circuit diagram illustrating an eighth example of the x-th driving module of the multiplex gate driving circuit according to an embodiment. FIG. 10B is a schematic timing waveform diagram illustrating associated signal processed by the x-th driving module of FIG. 10A. In this embodiment, the master signal is a positive pulse, and each of the slave signals includes plural positive pulses.

The x-th driving module 650 comprises a shift register 640 and three driving stages 651~65*n* (n=3). The shift register 640 comprises a bidirectional input circuit 642 and a shift unit 644. Since the x-th driving module 650 has three driving stages, three slave signals $P_1$~$P_3$ are respectively received by the three driving stages. It is noted that if the x-th driving module 650 has n driving stages, n slave signals are respectively received by the n driving stages.

The first driving stage 651 comprises a transistor $T_{P1}$ and a transistor $T_{N1}$. The first slave signal $P_1$ is received by the gate terminal of the transistor $T_{N1}$. The x-th master signal $S_x$ is received by the drain terminal of the transistor $T_{N1}$. The source terminal of the transistor $T_{P1}$ is connected with the source terminal of the transistor $T_{N1}$. The first slave signal $P_1$ is also received by the gate terminal of the transistor $T_{P1}$. An inverted power-off control signal $\overline{P_{OFF}}$ is received by the drain terminal of the transistor $T_{P1}$. The gate driving signal $Y_{3x-2}$ is outputted from the source terminal of the transistor $T_{N1}$. Similarly, the second slave signal $P_2$ is received by the second driving stage 652, and the third slave signal $P_3$ is received by the third driving stage 653. The connecting relationship is not redundantly described herein.

The bidirectional input circuit 624 comprises a transistor $T_{N4}$ and a transistor $T_{N5}$. A first voltage U2D (e.g. a high logic-level voltage) is received by the drain terminal of the transistor $T_{N4}$. The (x−1)-th notification signal $N_{x-1}$ from the (x−1)-th driving module (not shown) is received by the gate terminal of the transistor $T_{N4}$. The drain terminal of the transistor $T_{N5}$ is connected with the source terminal of the transistor $T_{N4}$. The (x+1)-th notification signal $N_{x+1}$ from the (x+1)-th driving module (not shown) is received by the gate terminal of the transistor $T_{N5}$. A second voltage D2U (e.g. a low logic-level voltage) is received by the source terminal of the transistor $T_{N5}$. Moreover, a control signal C is outputted from the source terminal of the transistor $T_{N4}$. Obviously, if the (x−1)-th notification signal $N_{x-1}$ is in the high level state, the control signal C is in the high level state; but if the (x+1)-th notification signal $N_{x-1}$ is in the high level state, the control signal C is in the low level state.

The shift unit 644 comprises a transistor $T_{N6}$, a transistor $T_{N7}$, a transistor $T_{N8}$, a transistor $T_{N9}$ and an inverter INV4. The control signal C is received by the gate terminal of the transistor $T_{N6}$. A clock signal CK is received by the drain terminal of the transistor $T_{N6}$. The control signal C is received by the gate terminal of the transistor $T_{N7}$. The source terminal and the drain terminal of the transistor $T_{N7}$ are connected to the source terminal of the transistor $T_{N6}$. The control signal C is also received by the drain terminal of the transistor $T_{N8}$. The source terminal of the transistor $T_{N8}$ is connected with the source terminal of the transistor $T_{N7}$. The drain terminal of the transistor $T_{N9}$ is connected with the source terminal of the transistor $T_{N7}$. A third voltage $V_{ss}$ (e.g. a low logic-level voltage) is received by the source terminal of the transistor $T_{N9}$. The control signal C is also received by the input terminal of the inverter INV4. The output terminal of the inverter INV4 is connected with the gate terminal of the transistor $T_{N8}$ and gate terminal of the transistor $T_{N9}$. Moreover, the x-th notification signal $N_x$ and the x-th master signal $S_x$ that have the same voltage level are outputted from the source terminal of the transistor $T_{N7}$.

Please refer to FIG. 10B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the high level state. From the time spot t1 to the time spot t2, the x-th master signal $S_x$ is in the high level state, and the first slave signal $P_1$ is in the high level state. Consequently, the gate driving signal $Y_{3x-2}$ is in the high level state. From the time spot t2 to the time spot t3, the x-th master signal $S_x$ is in the high level state, and the second slave signal $P_2$ is in the high level state. Consequently, the gate driving signal $Y_{3x-1}$ is in the high level state. From the time spot t3 to the time spot t4, the x-th master signal $S_x$ is in the high level state, and the third slave signal $P_3$ is in the high level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the low level state.

Moreover, at an arbitrary time spot t5 when the power-off control signal $P_{OFF}$ is changed from the high level state to the low level state (i.e. the inverted power-off control signal $\overline{P_{OFF}}$ is changed from the low level state to the high level state), all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

Figure 11A:
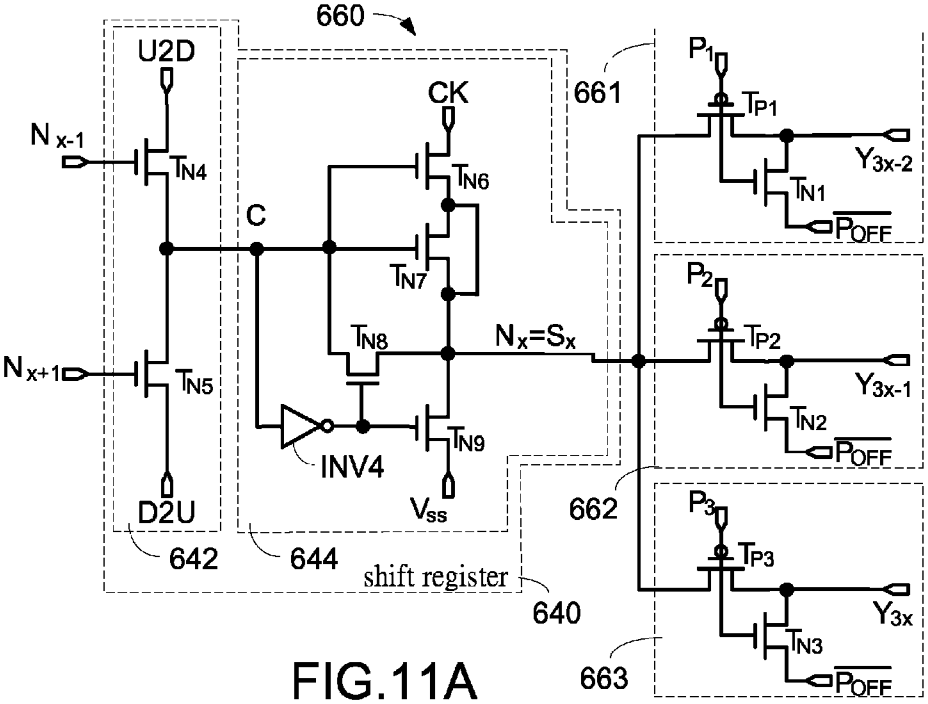
FIG. 11A is a schematic circuit diagram illustrating a ninth example of the x-th driving module of the multiplex gate driving circuit according to an embodiment.

FIG. 11A is a schematic circuit diagram illustrating a ninth example of the x-th driving module of the multiplex gate driving circuit according to an embodiment. FIG. 110B is a schematic timing waveform diagram illustrating associated signal processed by the x-th driving module of FIG. 11A. In this embodiment, the master signal is a positive pulse, and each of the slave signals includes plural negative pulses.

The x-th driving module 660 comprises a shift register 640 and three driving stages 661~**66*n* (n=3). The shift register 640 is identical to that of the eighth example, and is not redundantly described herein. Since the x-th driving module 660 has three driving stages, three slave signals $P_1$~$P_3$ are respectively received by the three driving stages. It is noted that if the x-th driving module 660** has n driving stages, n slave signals are respectively received by the n driving stages.

The first driving stage 661 comprises a transistor $T_{P1}$ and a transistor $T_{N1}$. The first slave signal $P_1$ is received by the gate terminal of the transistor $T_{P1}$. The x-th master signal $S_x$ is received by the source terminal of the transistor $T_{P1}$. The drain terminal of the transistor $T_{N1}$ is connected with the drain terminal of the transistor $T_{P1}$. The first slave signal $P_1$ is also received by the gate terminal of the transistor $T_{N1}$. An inverted power-off control signal $\overline{P_{OFF}}$ is received by the source terminal of the transistor $T_{N1}$. The gate driving signal $Y_{3x-2}$ is outputted from the drain terminal of the transistor $T_{P1}$. Similarly, the second slave signal $P_2$ is received by the second driving stage 662, and the third slave signal $P_3$ is received by the third driving stage 663.

Figure 11B:
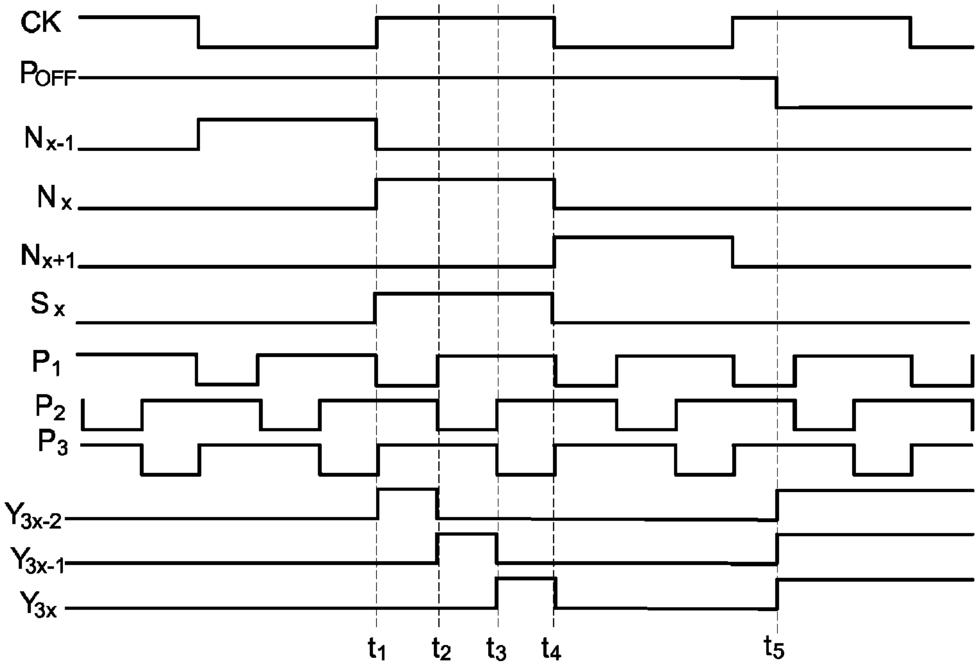
FIG. 11B is a schematic timing waveform diagram illustrating associated signal processed by the x-th driving module of FIG. 11A.

Please refer to FIG. 11B. At the time spot t1, the (x−1)-th notification signal $N_{x-1}$ is in the high level state, and the clock signal CK is switched to the high level state. Consequently, the x-th notification signal $N_x$ is in the high level state, and x-th master signal $S_x$ is in the high level state. From the time spot t1 to the time spot t2, the x-th master signal $S_x$ is in the high level state, and the first slave signal $P_1$ is in the low level state. Consequently, the gate driving signal $Y_{3x-2}$ is in the high level state. From the time spot t2 to the time spot t3, the x-th master signal $S_x$ is in the high level state, and the second slave signal $P_2$ is in the low level state. Consequently, the gate driving signal $Y_{3x-1}$ is in the high level state. From the time spot t3 to the time spot t4, the x-th master signal $S_x$ is in the high level state, and the third slave signal $P_3$ is in the low level state. Consequently, the gate driving signal $Y_{3x}$ is in the high level state. At the time spot t4, the (x+1)-th notification signal $N_{x+1}$ is in the high level state. Consequently, the x-th notification signal $N_x$ is in the low level state, and the x-th master signal $S_x$ is in the low level state.

Moreover, at an arbitrary time spot t5 when the power-off control signal $P_{OFF}$ is changed from the high level state to the low level state (i.e. the inverted power-off control signal $\overline{P_{OFF}}$ is changed from the low level state to the high level state), all of the gate driving signal $Y_{3x-2}$, $Y_{3x-1}$ and $Y_{3x}$ are switched to the high level state. Consequently, no image sticking phenomenon occurs in the thin film transistor array of the visible zone of the conventional LCD panel.

From the above description, the disclosure provides a multiplex gate driving circuit with plural driving modules. In comparison with the related art, each driving stage of the driving module has less number of transistors. From the first example to the seventh example, each driving stage is implemented by only four transistors (the inverter needs two transistors). In the eighth example and the ninth example, each driving stage is implemented by only two transistors. In other words, the driving stage of the multiplex gate driving circuit has less number of transistors, thereby reducing the layout area of the invisible zone of the LCD panel.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multiplex gate driving circuit, comprising:

m shift registers for receiving a clock signal and sequentially generating m master signals; and n driving stages for respectively receiving n slave signals and sequentially generating n gate driving signals, wherein a duty cycle of each slave signal is equal to 1/n;

wherein the m master signals are non-overlapped positive pulses with a first width, and an x-th shift register of the m shift registers generates an x-th master signal, a phase difference between every two adjacent slave signals is equal to 360/n degrees, and each of the n slave signals includes plural positive pulses;

wherein an i-th driving stage of the n driving stages comprises an n-type transistor and a p-type transistor, the n-type transistor has a control terminal receiving an i-th slave signal of the n slave signals, a first terminal receiving the x-th master signal and a second terminal generating an i-th gate driving signal of the n gate driving signals, the p-type transistor has a control terminal receiving the i-th slave signal, a first terminal connected with the second terminal of the n-type transistor and a second terminal receiving an inverted power-off control signal.

2. The multiplex gate driving circuit according to claim 1, wherein the x-th shift register comprises:

a bidirectional input circuit for receiving a (x−1)-th notification signal from a (x−1)-th shift register and a (x+1)-th notification signal from a (x+1)-th shift register, and generating a control signal; and a shift unit for generating an x-th notification signal and the x-th master signal according to the control signal.

3. The multiplex gate driving circuit according to claim 2, wherein the bidirectional input circuit comprises:

a first transistor having a control terminal receiving the (x−1)-th notification signal, a first terminal receiving a first voltage and a second terminal generating the control signal; and a second transistor having a control terminal receiving the (x+1)-th notification signal, a first terminal connected with the second terminal of the first transistor and a second terminal receiving a second voltage.

4. The multiplex gate driving circuit according to claim 2, wherein the shift unit comprises:

a third transistor having a control terminal receiving the control signal, a first terminal receiving the clock signal and a second terminal generating the x-th notification signal and the x-th master signal;

a fourth transistor having a control terminal receiving the control signal, and a first terminal and second terminal connected with the second terminal of the third transistor;

a fifth transistor having a first terminal receiving the control signal and a second terminal connected with the second terminal of the third transistor;

a sixth transistor having a first terminal connected with the second terminal of the third transistor and a second terminal receiving a third voltage; and an inverter having an input terminal receiving the control signal and an output terminal connected with a control terminal of the fifth transistor and a control terminal of the sixth transistor.

5. A multiplex gate driving circuit, comprising m shift registers for receiving a clock signal and sequentially generating m master signals; and n driving stages for respectively receiving n slave signals and sequentially generating n gate driving signals, wherein a duty cycle of each slave signal is equal to 1/n;

wherein the m master signals are non-overlapped positive pulses with a first width, and an x-th shift register of the m shift registers generates an x-th master signal, a phase difference between every two adjacent slave signals is equal to 360/n degrees, and each of the n slave signals includes plural negative pulses;

wherein an i-th driving stage of the n driving stages comprises an n-type transistor and a p-type transistor, the p-type transistor has a control terminal receiving an i-th slave signal of the n slave signals, a first terminal receiving the x-th master signal and a second terminal generating an i-th gate driving signal of the n gate driving signals, and the n-type transistor has a control terminal receiving the i-th slave signal, a first terminal connected with the second terminal of the p-type transistor and a second terminal receiving an inverted power-off control signal.

6. The multiplex gate driving circuit according to claim 5, wherein the x-th shift register comprises:

a bidirectional input circuit for receiving a (x−1)-th notification signal from a (x−1)-th shift register and a (x+1)-th notification signal from a (x+1)-th shift register, and generating a control signal; and a shift unit for generating an x-th notification signal and the x-th master signal according to the control signal.

7. The multiplex gate driving circuit according to claim 6, wherein the bidirectional input circuit comprises:

a first transistor having a control terminal receiving the (x−1)-th notification signal, a first terminal receiving a first voltage and a second terminal generating the control signal; and a second transistor having a control terminal receiving the (x+1)-th notification signal, a first terminal connected with the second terminal of the first transistor and a second terminal receiving a second voltage.

8. The multiplex gate driving circuit according to claim 6, wherein the shift unit comprises:

a third transistor having a control terminal receiving the control signal, a first terminal receiving the clock signal and a second terminal generating the x-th notification signal and the x-th master signal;

a fourth transistor having a control terminal receiving the control signal, and a first terminal and second terminal connected with the second terminal of the third transistor;

a fifth transistor having a first terminal receiving the control signal and a second terminal connected with the second terminal of the third transistor;

a sixth transistor having a first terminal connected with the second terminal of the third transistor and a second terminal receiving a third voltage; and an inverter having an input terminal receiving the control signal and an output terminal connected with a control terminal of the fifth transistor and a control terminal of the sixth transistor.

9. A multiplex gate driving circuit, comprising:

m shift registers for receiving a clock signal and sequentially generating m master signals; and n driving stages for respectively receiving n slave signals and sequentially generating n gate driving signals, wherein a duty cycle of each slave signal is equal to 1/n;

wherein the m master signals are non-overlapped negative pulses with a first width, and an x-th shift register of the m shift registers generates an x-th master signal, a phase difference between every two adjacent slave signals is equal to 360/n degrees, and each of the n slave signals includes plural positive pulses;

wherein an i-th driving stage of the n driving stages comprises an n-type transistor, a p-type transistor and an inverter, the n-type transistor has a control terminal receiving an i-th slave signal of the n slave signals and a first terminal receiving the x-th master signal, the inverter has an input terminal connected with a second terminal of the n-type transistor and an output terminal generating an i-th gate driving signal of the n gate driving signals, and the p-type transistor has a control terminal receiving the i-th slave signal, a first terminal connected with the second terminal of the n-type transistor and a second terminal receiving a power-off control signal.

10. The multiplex gate driving circuit according to claim 9, wherein the x-th shift register comprises:

a bidirectional input circuit for receiving a (x−1)-th notification signal from a (x−1)-th shift register and a (x+1)-th notification signal from a (x+1)-th shift register, and generating a control signal; and a shift unit for generating an x-th notification signal and the x-th master signal according to the control signal.

11. The multiplex gate driving circuit according to claim 10, wherein the bidirectional input circuit comprises:

a first transistor having a control terminal receiving the (x−1)-th notification signal, a first terminal receiving a first voltage and a second terminal generating the control signal; and a second transistor having a control terminal receiving the (x+1)-th notification signal, a first terminal connected with the second terminal of the first transistor and a second terminal receiving a second voltage.

12. The multiplex gate driving circuit according to claim 10, wherein the shift unit comprises:

a third transistor having a control terminal receiving the control signal, a first terminal receiving the clock signal and a second terminal generating the x-th notification signal;

a fourth transistor having a control terminal receiving the control signal, and a first terminal and second terminal connected with the second terminal of the third transistor;

a fifth transistor having a first terminal receiving the control signal and a second terminal connected with the second terminal of the third transistor;

a sixth transistor having a first terminal connected with the second terminal of the third transistor and a second terminal receiving a third voltage;

a first inverter having an input terminal receiving the control signal and an output terminal connected with a control terminal of the fifth transistor and a control terminal of the sixth transistor; and a NAND gate having a first input terminal receiving the x-th notification signal, a second input terminal receiving the power-off control signal and an output terminal generating the x-th master signal.

13. The multiplex gate driving circuit according to claim 10, wherein the shift unit comprises:

a seventh transistor having a control terminal receiving the control signal, a first terminal receiving the clock signal and a second terminal generating the x-th notification signal;

an eighth transistor having a control terminal receiving the control signal, and a first terminal and second terminal connected with the second terminal of the seventh transistor;

a ninth transistor having a first terminal receiving the control signal and a second terminal connected with the second terminal of the seventh transistor;

a tenth transistor having a first terminal connected with the second terminal of the seventh transistor and a second terminal receiving a fourth voltage;

a second inverter having an input terminal receiving the control signal and an output terminal connected with a control terminal of the ninth transistor and a control terminal of the tenth transistor; and a third inverter having an input terminal receiving the x-th notification signal and an output terminal generating the x-th master signal.

14. The multiplex gate driving circuit according to claim 10, wherein the shift unit comprises:

an eleventh transistor having a control terminal receiving the control signal, a first terminal receiving the clock signal and a second terminal generating the x-th notification signal and the x-th master signal;

a twelfth transistor having a control terminal receiving the control signal, and a first terminal and second terminal connected with the second terminal of the eleventh transistor;

a thirteenth transistor having a first terminal receiving the control signal and a second terminal connected with the second terminal of the eleventh transistor;

a fourteenth transistor having a first terminal connected with the second terminal of the eleventh transistor and a second terminal receiving a fifth voltage; and a fourth inverter having an input terminal receiving the control signal and an output terminal connected with a control terminal of the thirteenth transistor and a control terminal of the fourteenth transistor.

15. A multiplex gate driving circuit, comprising:

m shift registers for receiving a clock signal and sequentially generating m master signals; and n driving stages for respectively receiving n slave signals and sequentially generating n gate driving signals, wherein a duty cycle of each slave signal is equal to 1/n;

wherein the m master signals are non-overlapped negative pulses with a first width, and an x-th shift register of the m shift registers generates an x-th master signal, a phase difference between every two adjacent slave signals is equal to 360/n degrees, and each of the n slave signals includes plural negative pulses.

16. The multiplex gate driving circuit according to claim 15, wherein an i-th driving stage of the n driving stages comprises an n-type transistor, a p-type transistor and an inverter, wherein the p-type transistor has a control terminal receiving an i-th slave signal of the n slave signals and a first terminal receiving the x-th master signal, wherein the inverter has an input terminal connected with a second terminal of the p-type transistor and an output terminal generating an i-th gate driving signal of the n gate driving signals, wherein the n-type transistor has a control terminal receiving the i-th slave signal, a first terminal connected with the second terminal of the p-type transistor and a second terminal receiving a power-off control signal.

17. The multiplex gate driving circuit according to claim 16, wherein the x-th shift register comprises:

a bidirectional input circuit for receiving a (x−1)-th notification signal from a (x−1)-th shift register and a (x+1)-th notification signal from a (x+1)-th shift register, and generating a control signal; and a shift unit for generating an x-th notification signal and the x-th master signal according to the control signal.

18. The multiplex gate driving circuit according to claim 17, wherein the bidirectional input circuit comprises:

a first transistor having a control terminal receiving the (x−1)-th notification signal, a first terminal receiving a first voltage and a second terminal generating the control signal; and a second transistor having a control terminal receiving the (x+1)-th notification signal, a first terminal connected with the second terminal of the first transistor and a second terminal receiving a second voltage.

19. The multiplex gate driving circuit according to claim 17, wherein the shift unit comprises:

a third transistor having a control terminal receiving the control signal, a first terminal receiving the clock signal and a second terminal generating the x-th notification signal;

a fourth transistor having a control terminal receiving the control signal, and a first terminal and second terminal connected with the second terminal of the third transistor;

a fifth transistor having a first terminal receiving the control signal and a second terminal connected with the second terminal of the third transistor;

a sixth transistor having a first terminal connected with the second terminal of the third transistor and a second terminal receiving a third voltage;

a first inverter having an input terminal receiving the control signal and an output terminal connected with a control terminal of the fifth transistor and a control terminal of the sixth transistor; and a NAND gate having a first input terminal receiving the x-th notification signal, a second input terminal receiving the power-off control signal and an output terminal generating the x-th master signal.

20. The multiplex gate driving circuit according to claim 17, wherein the shift unit comprises:

a seventh transistor having a control terminal receiving the control signal, a first terminal receiving the clock signal and a second terminal generating the x-th notification signal;

an eighth transistor having a control terminal receiving the control signal, and a first terminal and second terminal connected with the second terminal of the seventh transistor;

a ninth transistor having a first terminal receiving the control signal and a second terminal connected with the second terminal of the seventh transistor;

a tenth transistor having a first terminal connected with the second terminal of the seventh transistor and a second terminal receiving a fourth voltage;

a second inverter having an input terminal receiving the control signal and an output terminal connected with a control terminal of the ninth transistor and a control terminal of the tenth transistor; and a third inverter having an input terminal receiving the x-th notification signal and an output terminal generating the x-th master signal.

21. The multiplex gate driving circuit according to claim 17, wherein the shift unit comprises:

an eleventh transistor having a control terminal receiving the control signal, a first terminal receiving the clock signal and a second terminal generating the x-th notification signal and the x-th master signal;

a twelfth transistor having a control terminal receiving the control signal, and a first terminal and second terminal connected with the second terminal of the eleventh transistor;

a thirteenth transistor having a first terminal receiving the control signal and a second terminal connected with the second terminal of the eleventh transistor;

a fourteenth transistor having a first terminal connected with the second terminal of the eleventh transistor and a second terminal receiving a fifth voltage; and a fourth inverter having an input terminal receiving the control signal and an output terminal connected with a control terminal of the thirteenth transistor and a control terminal of the fourteenth transistor.

22. The multiplex gate driving circuit according to claim 15, wherein an i-th driving stage of the n driving stages comprises an n-type transistor, a p-type transistor and an inverter, wherein the p-type transistor has a control terminal receiving the x-th master signal and a first terminal receiving an i-th slave signal of the n slave signals, wherein the inverter has an input terminal connected with a second terminal of the p-type transistor and an output terminal generating an i-th gate driving signal of the n gate driving signals, wherein the n-type transistor has a control terminal receiving the x-th master signal, a first terminal connected with the second terminal of the p-type transistor and a second terminal receiving a power-off control signal.

23. The multiplex gate driving circuit according to claim 22, wherein the x-th shift register comprises:

a bidirectional input circuit for receiving a (x−1)-th notification signal from a (x−1)-th shift register and a (x+1)-th notification signal from a (x+1)-th shift register, and generating a control signal; and a shift unit for generating an x-th notification signal and the x-th master signal according to the control signal and the power-off control signal.

24. The multiplex gate driving circuit according to claim 23, wherein the bidirectional input circuit comprises:

a first transistor having a control terminal receiving the (x−1)-th notification signal, a first terminal receiving a first voltage and a second terminal generating the control signal; and a second transistor having a control terminal receiving the (x+1)-th notification signal, a first terminal connected with the second terminal of the first transistor and a second terminal receiving a second voltage.

25. The multiplex gate driving circuit according to claim 23, wherein the shift unit comprises:

a third transistor having a control terminal receiving the control signal, a first terminal receiving the clock signal and a second terminal generating the x-th notification signal;

a fourth transistor having a control terminal receiving the control signal, and a first terminal and second terminal connected with the second terminal of the third transistor;

a fifth transistor having a first terminal receiving the control signal and a second terminal connected with the second terminal of the third transistor;

a sixth transistor having a first terminal connected with the second terminal of the third transistor and a second terminal receiving a third voltage;

an inverter having an input terminal receiving the control signal and an output terminal connected with a control terminal of the fifth transistor and a control terminal of the sixth transistor; and a NAND gate having a first input terminal receiving the x-th notification signal, a second input terminal receiving the power-off control signal and an output terminal generating the x-th master signal.

* * * * *